US011887532B2

(12) United States Patent
Kim

(10) Patent No.: US 11,887,532 B2
(45) Date of Patent: Jan. 30, 2024

(54) GATE DRIVING CIRCUIT AND DISPLAY DEVICE

(71) Applicant: LG Display Co., Ltd., Seoul (KR)

(72) Inventor: YongHo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/974,447

(22) Filed: Oct. 26, 2022

(65) Prior Publication Data

US 2023/0139398 A1 May 4, 2023

(30) Foreign Application Priority Data

Nov. 4, 2021 (KR) .......................... 10-2021-0150885

(51) Int. Cl.
*G09G 3/32* (2016.01)
*G09G 3/3233* (2016.01)

(52) U.S. Cl.
CPC ............ *G09G 3/32* (2013.01); *G09G 3/3233* (2013.01); *G09G 2300/0819* (2013.01); *G09G 2300/0842* (2013.01); *G09G 2310/0267* (2013.01); *G09G 2310/0286* (2013.01); *G09G 2310/0291* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2007/0296662 A1* | 12/2007 | Lee ...................... | G09G 3/3677 345/87 |
| 2015/0317954 A1* | 11/2015 | Jang .................... | G09G 3/3677 345/82 |
| 2016/0293094 A1* | 10/2016 | Park ...................... | G11C 19/28 |
| 2020/0380911 A1 | 12/2020 | Park et al. | |
| 2021/0201770 A1* | 7/2021 | Park ...................... | G11C 19/28 |
| 2022/0093027 A1* | 3/2022 | Hong ................... | G09G 3/2092 |
| 2022/0093028 A1* | 3/2022 | Hong ..................... | G09G 3/20 |

FOREIGN PATENT DOCUMENTS

| KR | 20190009216 A | 1/2019 |
|---|---|---|
| KR | 20200049677 A | 5/2020 |

* cited by examiner

*Primary Examiner* — Dorothy Harris
(74) *Attorney, Agent, or Firm* — Seed IP Law Group LLP

(57) ABSTRACT

Disclosed are a gate driving circuit including a first gate output buffer circuit and a control circuit, and a display device including the same. The control circuit may include a first transistor connected between a first driving voltage node and a QB node, two second transistors connected in series between the QB node and a second low level voltage node, a third transistor connected between a connection node of the two second transistors and the first driving voltage node, a fourth transistor connected between the gate node of the first transistor and the first driving voltage node, and two fifth transistors connected in series between the gate node of the first transistor and the second low level voltage node. A connection node of the two fifth transistors may be electrically connected to the source node or the drain node of the third transistor.

21 Claims, 14 Drawing Sheets

S-MODE

Vsen Wave

F-MODE

Vsen Wave

GATE DRIVING CIRCUIT AND DISPLAY DEVICE

CROSS-REFERENCE TO RELATED APPLICATION

This application claims priority from Korean Patent Application No. 10-2021-0150885, filed on Nov. 4, 2021, which is hereby incorporated by reference for all purposes as if fully set forth herein.

BACKGROUND

Technical Field

Embodiments of the present disclosure relate to a gate driving circuit and a display device.

Description of the Related Art

With the development of the information society, the demand for display devices for displaying images is increasing in various forms. In recent years, various display devices such as a liquid crystal display device and an organic light-emitting display device have been utilized.

For image display, a display device includes a display panel in which multiple data lines and multiple gate lines are disposed, a data driving circuit configured to output data signals to the multiple data lines, a gate driving circuit configured to output gate signals to the multiple gate lines, etc.

When a conventional display device drives multiple gate lines using a gate driving circuit, a gate signal output to the gate lines should have a high level voltage and a low level voltage according to a gate driving timing.

BRIEF SUMMARY

The inventors have realized and identified that in the case of a conventional gate driving circuit, a phenomenon in which a gate signal having an abnormal signal waveform is output from the gate driving circuit occurs. This phenomenon may be a factor that degrades image quality as well as gate driving performance. Here, an abnormal gate waveform may be anything different from the normal signal waveform. For example, when a voltage level in a gate signal does not reach a desired level or when a voltage level variation timing in a gate signal does not match, the corresponding gate signal can be said to have an abnormal signal waveform.

The inventors also realize that when, in order to compensate for deviation between characteristic values of transistors included in sub-pixels, a display device performs sensing-driving to sense the characteristic values of the transistors, a phenomenon in which a gate signal having an abnormal signal waveform is output from a gate driving circuit may be prominent.

In the display field, a gate driving circuit for driving gate lines disposed on a display panel is used, but there is a problem with the gate driving circuit outputting a gate signal having an abnormal signal waveform. Accordingly, the inventor of the present disclosure identified a cause of the problem with the gate driving circuit outputting a gate signal having an abnormal signal waveform through much research and many experiments, and the present disclosure describes embodiments of a gate driving circuit and a display device that solve this problem.

Embodiments of the present disclosure may provide a display device and a gate driving circuit configured to output a gate signal having a normal signal waveform.

Embodiments of the present disclosure may provide a display device and a gate driving circuit configured to output a gate signal having a normal signal waveform while performing gate driving for sensing-driving to sense the mobility of a driving transistor in a sub-pixel.

Embodiments of the present disclosure may provide a gate driving circuit including a first gate output buffer circuit including a first pull-up transistor and a first pull-down transistor and a control circuit configured to control a voltage of a Q node connected to a gate node of the first pull-up transistor and a voltage of a QB node connected to a gate node of the first pull-down transistor.

The first pull-up transistor may be connected between a first clock signal input node and a first gate output node, and the first pull-down transistor may be connected between the first gate output node and a first low level voltage node.

The control circuit may include a first transistor connected between a first driving voltage node and the QB node, two second transistors connected in series between the QB node and a second low level voltage node, a third transistor connected between a connection node of the two second transistors and the first driving voltage node, a fourth transistor connected between a gate node of the first transistor and the first driving voltage node, and two fifth transistors connected in series between the gate node of the first transistor and the second low level voltage node.

A connection node of the two fifth transistors may be electrically connected to a source node or a drain node of the third transistor.

The drain node or the source node of the third transistor may be connected to the first driving voltage node, and the source node or the drain node of the third transistor may be connected to the connection node of the two second transistors and the connection node of the two fifth transistors.

Each of the two second transistors may have a gate node connected to the Q node.

The third transistor may have a gate node connected to the QB node.

Each of the two fifth transistors may have a gate node connected to the Q node.

The third transistor may include two transistors connected in series between the first driving voltage node and the connection node of the two second transistors.

A second low level voltage applied to the second low level voltage node may be lower than a first low level voltage applied to the first low level voltage node.

Embodiments of the present disclosure may provide a display device including a display panel including multiple gate lines and a gate driving circuit configured to drive the multiple gate lines.

The gate driving circuit may include a first gate output buffer circuit including a first pull-up transistor and a first pull-down transistor and a control circuit configured to control a voltage of a Q node connected to a gate node of the first pull-up transistor and a voltage of a QB node connected to a gate node of the first pull-down transistor.

The first pull-up transistor may be connected between a first clock signal input node and a first gate output node, and the first pull-down transistor may be connected between the first gate output node and a first low level voltage node.

The control circuit may include a first transistor connected between a first driving voltage node and the QB node, two second transistors connected in series between the QB node and a second low level voltage node, a third transistor connected between a connection node of the two second transistors and the first driving voltage node, a fourth transistor connected between a gate node of the first transistor and the first driving voltage node, and two fifth transistors connected in series between the gate node of the first transistor and the second low level voltage node.

A connection node of the two fifth transistors may be electrically connected to a source node or a drain node of the third transistor.

The drain node or the source node of the third transistor may be connected to the first driving voltage node, and the source node or the drain node of the third transistor may be connected to the connection node of the two second transistors and the connection node of the two fifth transistors.

Each of the two second transistors may have a gate node connected to the Q node.

The third transistor may have a gate node connected to the QB node.

Each of the two fifth transistors may have a gate node connected to the Q node.

The third transistor may include two transistors connected in series between the first driving voltage node and the connection node of the two second transistors.

A second low level voltage applied to the second low level voltage node may be lower than a first low level voltage applied to the first low level voltage node.

In accordance with various embodiments, a display device comprises a display panel and a gate driving circuit. The display panel includes a gate line. The gate driving circuit, in operation, drives the gate line, and includes a gate output buffer circuit and a control circuit. The gate output buffer circuit is coupled to the gate line, and includes a pull-up transistor having a gate node connected to a Q node, and a pull-down transistor having a gate node connected to a QB node. The control circuit includes a first transistor coupled to the QB node. The control circuit, in operation: applies a second low level voltage of a second low level voltage node to a gate node of the first transistor and a source node of the first transistor when voltage of the Q node is at a first level; and electrically isolates the second low level voltage node from the gate node of the first transistor when a ripple in the voltage of the Q node is applied to a gate node of a second control transistor connected between the gate node of the first transistor and the second low level voltage node.

According to embodiments of the present disclosure, it is possible to provide a display device and a gate driving circuit configured to output a gate signal having a normal signal waveform.

According to embodiments of the present disclosure, it is possible to provide a display device and a gate driving circuit configured to output a gate signal having a normal signal waveform while performing gate driving for sensing-driving to sense the mobility of a driving transistor in a sub-pixel.

BRIEF DESCRIPTION OF THE SEVERAL VIEWS OF THE DRAWINGS

The above and other aspects, features and advantages of the present disclosure will be more apparent from the following detailed description taken in conjunction with the accompanying drawings, in which.

DETAILED DESCRIPTION

Figure 1:
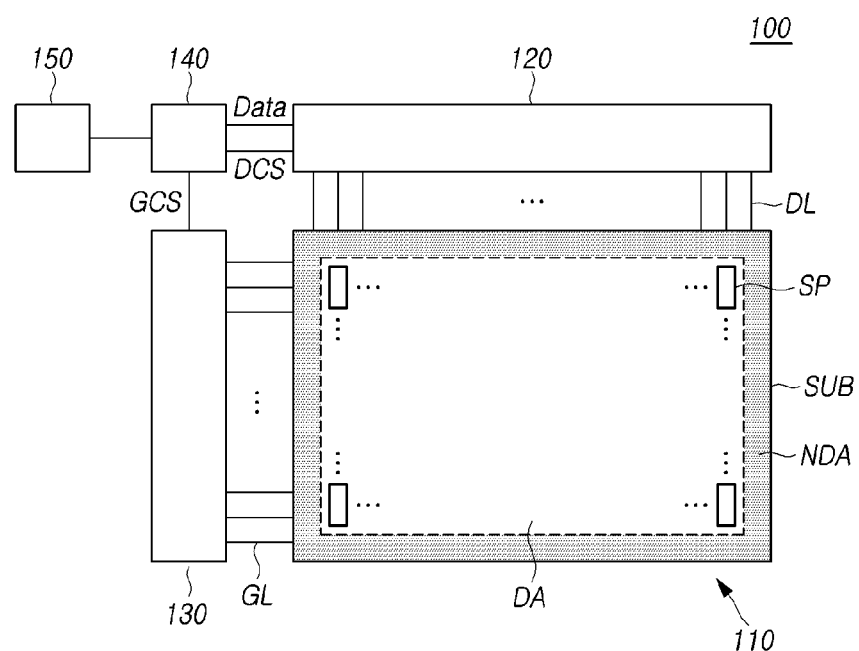
FIG. 1 is a configuration diagram of a display device according to embodiments of the present disclosure.

In the following description of examples or embodiments of the present disclosure, reference will be made to the accompanying drawings in which specific examples or embodiments that can be implemented are shown by way of illustration, and in which the same reference numerals and signs can be used to designate the same or like components even when they are shown in different drawings. Further, in the following description of examples or embodiments of the present disclosure, detailed descriptions of well-known functions and components incorporated herein will be omitted when it is determined that the description may make the subject matter in some embodiments of the present disclosure rather unclear. Terms such as "including," "having," "containing," "constituting," "made up of," and "formed of" used herein are generally intended to allow other components to be added unless the terms are used with the term "only." As used herein, singular forms are intended to include plural forms unless the context clearly indicates otherwise.

Terms such as "first," "second," "A," "B," "(A)," or "(B)" may be used herein to describe elements of the present disclosure. Such terms are not used to define the essence, order, sequence, or number of elements, etc., but are used merely to distinguish a corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, or manufacturing methods, these terms may be used to describe non-consecutive or non-sequential processes or operations unless the term "directly" or "immediately" is used together.

In addition, when any dimensions, relative sizes, etc., are mentioned, numerical values for elements or features, or corresponding information (e.g., level, range, etc.) should be considered to include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the present disclosure will be described in detail with reference to the accompanying drawings.

FIG. 1 is a configuration diagram of a display device 100 according to embodiments of the present disclosure.

Referring to FIG. 1, the display device 100 according to embodiments of the present disclosure may include a display panel 110 and a driving circuit for driving the display panel 110.

The driving circuit may include a data driving circuit 120, a gate driving circuit 130, and the like and may further include a controller 140 that controls the data driving circuit 120 and the gate driving circuit 130.

The display panel 110 may include a substrate SUB and signal lines such as multiple data lines DL and multiple gate lines GL disposed on the substrate SUB. The display panel 110 may include multiple data lines DL and multiple sub-pixels SP connected to the multiple gate lines GL.

The display panel 110 may include a display area DA where images are displayed and a non-display area NDA where no images are displayed. In the display panel 110, multiple sub-pixels SP for displaying images may be disposed in the display area DA, driving circuits 120, 130, and 140 may be electrically connected to or mounted in the non-display area NDA, and a pad unit or structure to which an integrated circuit, a printed circuit or the like is to be connected may be disposed in the non-display area NDA.

The data driving circuit 120, which is a circuit for driving the multiple data lines DL, may supply data signals to the multiple data lines DL. The gate driving circuit 130, which is a circuit for driving the multiple gate lines GL, may supply gate signals to the multiple gate lines GL. A controller 140 may supply a data control signal DCS to the data driving circuit 120 in order to control the operation timing of the data driving circuit 120. The controller 140 may supply a gate control signal GCS to the gate driving circuit 130 in order to control the operation timing of the gate driving circuit 130.

The controller 140 may start scanning according to a timing implemented in each frame, convert input image data input from the outside into a data signal format used for the data driving circuit 120, supply the converted image data Data to the data driving circuit 120, and control data driving at an appropriate time according to the scanning.

The controller 140 receives various timing signals including, along with the input image data, a vertical synchronization signal VSYNC, a horizontal synchronization signal HSYNC, an input data enable signal Data Enable DE, a clock signal CLK, and the like from the outside (e.g., a host system 150).

To control the data driving circuit 120 and the gate driving circuit 130, the controller 140 receives timing signals such as the vertical synchronization signal VSYNC, the horizontal synchronization signal HSYNC, the input data enable signal DE and the clock signal CLK, generates various control signals DCS and GCS, and outputs the control signals DCS and GCS to the data driving circuit 120 and the gate driving circuit 130, respectively.

For example, in order to control the gate driving circuit 130, the controller 140 outputs various gate control signals GCS including a gate start pulse (GPS), a gate shift clock (GSC), a gate output enable signal (GOE), and the like.

Also, in order to control the data driving circuit 120, the controller 140 outputs various data control signals DCS including a source start pulse (SSP), a source sampling clock (SSC), a source output enable signal (SOE), and the like.

The controller 140 may be implemented as a separate component from the data driving circuit 120 or may be integrated with the data driving circuit 120 and implemented as an integrated circuit.

The data driving circuit 120 drives the multiple data lines DL by receiving the image data Data from the controller 140 and supplying a data voltage to the multiple data lines DL. Here, the data driving circuit 120 is also referred to as a source driving circuit.

The data driving circuit 120 may include one or more source driver integrated circuits SDIC. Each source driver integrated circuit SDIC may include a shift register, a latch circuit, a digital-to-analog converter (DAC), an output buffer, etc. Each source driver integrated circuit SDIC may further include an analog-to-digital converter (ADC) depending on the case.

For example, each source driver integrated circuit SDIC may be connected to the display panel 110 by a tape automated bonding (TAB) method, may be connected to a bonding pad of the display panel 110 by a chip-on-glass (COG) or a chip-on-panel (COP) method, or may be implemented by a chip-on-film (COF) method and connected to the display panel.

The gate driving circuit 130 may output a gate signal of a turn-on level voltage or output a gate signal of a turn-off level voltage according to the control of the controller 140. The gate driving circuit 130 may sequentially drive the multiple gate lines GL by sequentially supplying the gate signal of the turn-on level voltage to the multiple gate lines GL.

The gate driving circuit 130 may be connected to the display panel by the TAB method, may be connected to the bonding pad of the display panel 110 by the COG or COP method, or may be connected to the display panel 110 by the COF method. Alternatively, the gate driving circuit 130 may be formed in the non-display area NDA of the display panel 110 in a gate-in-panel (GIP) type. The gate driving circuit 130 may be disposed on the substrate SUB or connected to the substrate SUB. That is, the gate driving circuit 130 may be disposed in the non-display area NDA of the substrate SUB in the case of the GIP type. The gate driving circuit 130 may be connected to the substrate SUB in the case of the COG type, the COF type, etc.

Meanwhile, at least one of the data driving circuit 120 and the gate driving circuit 130 may be disposed in the display area DA. For example, at least one of the data driving circuit 120 and the gate driving circuit 130 may be disposed not to overlap the sub-pixels SP or may be disposed to partially or entirely overlap the sub-pixels SP.

When a specific gate line GL is opened by the gate driving circuit 130, the data driving circuit 120 may convert the image data Data received from the controller 140 into an analog data voltage and supply the analog data voltage to the multiple data lines DL.

The data driving circuit 120 may be connected to one side (e.g., an upper side or a lower side) of the display panel 110. Depending on the driving method, the panel designing method, etc., the data driving circuit 120 may be connected to both sides (e.g., an upper side and a lower side) of the display panel 110 or may be connected to two or more of four sides of the display panel 110.

The gate driving circuit 130 may be connected to one side (e.g., a left side or a right side) of the display panel 110. Depending on the driving method, the panel designing method, etc., the gate driving circuit 130 may be connected to two opposite sides (e.g., a left side and a right side) of the display panel 110 or may be connected to two or more of four sides of the display panel 110.

The controller 140 may be a timing controller used in conventional display technology, a control device capable of further performing other control functions including the timing controller, a control device different from the timing controller, or a circuit in a control device. The controller 140 may be implemented with various circuits or electronic components, such as an integrated circuit (IC), a field-programmable gate array (FPGA), an application-specific integrated circuit (ASIC), or a processor.

The controller 140 may be mounted on a printed circuit board, a flexible printed circuit, or the like and may be electrically connected to the data driving circuit 120 and the gate driving circuit 130 through the printed circuit board, the flexible printed circuit, or the like.

The controller 140 may transmit or receive signals to or from the data driving circuit 120 according to one or more predetermined or selected interfaces. Here, for example, the interfaces may include a low voltage differential signaling (LVDS) interface, an embedded panel interface (EPI), a serial peripheral interface (SPI), etc.

The controller 140 may include one or more memory media such as a register.

The display device 100 according to the embodiments may be a display including a backlight unit such as a liquid crystal display and may be a self-luminous display such as an organic light-emitting diode (OLED) display, a quantum dot display, and a micro light-emitting diode (LED) display.

When the display device 100 according to the embodiments is an OLED display, each sub-pixel SP may include an OLED, which emits light by itself, as a light-emitting device. When the display device 100 according to the embodiments is a quantum dot display, each sub-pixel SP may include a light-emitting device made of quantum dots, which are semiconductor crystals that emit light by themselves. When the display device 100 according to the embodiments is a micro LED display, each sub-pixel SP may include a micro LED, which emits light by itself and is made based on inorganic materials, as a light-emitting device.

Figure 2A:
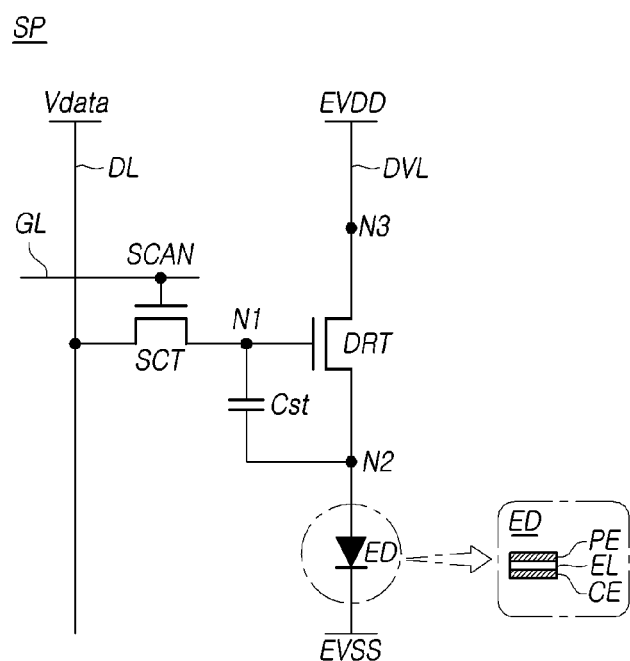
FIGS. 2A and 2B are equivalent circuits of a sub-pixel of a display device according to embodiments of the present disclosure.
Figure 2B:
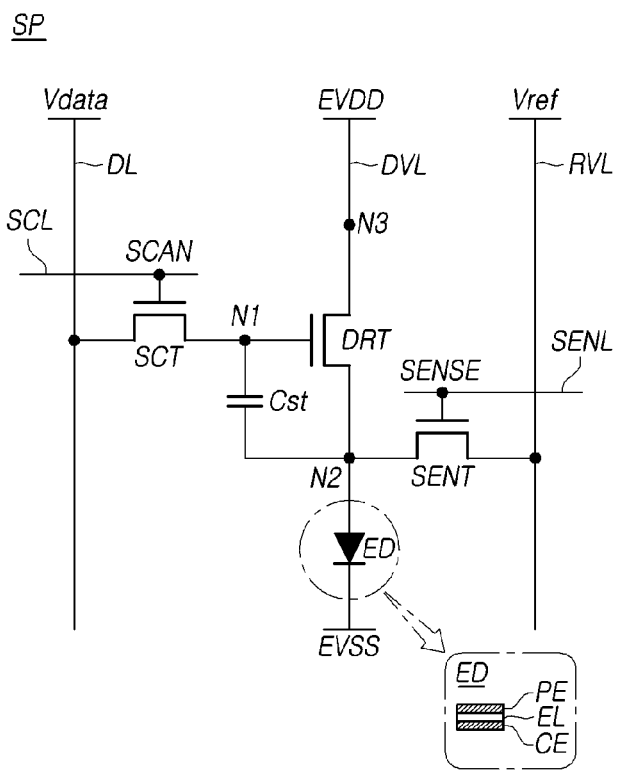

FIGS. 2A and 2B are equivalent circuits of the sub-pixel SP of the display device 100 according to embodiments of the present disclosure.

Referring to FIG. 2A, multiple sub-pixels SP disposed on the display panel 110 of the display device 100 according to embodiments of the present disclosure may each include a light-emitting device ED, a driving transistor DRT, a scan transistor SCT, and a storage capacitor Cst.

Referring to FIG. 2A, the light-emitting device ED may include a pixel electrode PE and a common electrode CE and may include a light-emitting layer EL disposed between the pixel electrode PE and the common electrode CE.

The pixel electrode PE of the light-emitting device ED may be an electrode disposed on each sub-pixel SP, and the common electrode CE may be an electrode disposed on all the sub-pixels SP in common. Here, the pixel electrode PE may be an anode electrode, and the common electrode CE may be a cathode electrode. Conversely, the pixel electrode PE may be a cathode electrode, and the common electrode CE may be an anode electrode.

For example, the light-emitting device ED may be an organic light-emitting diode (OLED), a light-emitting diode (LED), or a quantum dot light-emitting device.

The driving transistor DRT, which is a transistor for driving the light-emitting device ED, may include a first node N1, a second node N2, a third node N3, etc.

The first node N1 of the driving transistor DRT may be a gate node of the driving transistor DRT and may be electrically connected to the source node or drain node of the scan transistor SCT. The second node N2 of the driving transistor DRT may be the source node or drain node of the driving transistor DRT and electrically connected to the pixel electrode PE of the light-emitting device ED. The third node N3 of the driving transistor DRT may be electrically connected to a driving voltage line DVL for supplying a driving voltage EVDD.

The scan transistor SCT may be controlled by a scan signal SCAN, which is a kind of gate signal, and may be connected between the data line DL and the first node N1 of the driving transistor DRT. In other words, the scan transistor SCT may be turned on or turned off according to the scan signal SCAN supplied to a scan signal line SCL, which is a kind of gate line GL, and may control connection between the first node N1 of the driving transistor DRT and the data line DL.

The scan transistor SCT may be turned on by the scan signal SCAN having the turn-on level voltage and may deliver a data voltage Vdata supplied from the data line DL to the first node N1 of the driving transistor DRT.

Here, when the scan transistor SCT is an n-type transistor, the turn-on level voltage of the scan signal SCAN may be a high level voltage. When the scan transistor SCT is a p-type transistor, the turn-on level voltage of the scan signal SCAN may be a low level voltage.

The storage capacitor Cst may be connected between the first node N1 and the second node N2 of the driving transistor DRT. The storage capacitor Cst is charged with an amount of charge corresponding to the voltage difference between both ends and serves to maintain the voltage difference between both ends for a predetermined or selected frame time. Accordingly, for the predetermined or selected frame time, the corresponding sub-pixel SP may emit light.

Referring to FIG. 2B, multiple sub-pixels SP disposed on the display panel 110 of the display device 100 according to embodiments of the present disclosure may each include a sensing transistor SENT.

The sensing transistor SENT may be controlled by a sense signal SENSE, which is a kind of gate signal, and may be connected between the reference voltage line RVL and the second node N2 of the driving transistor DRT. In other words, the sensing transistor SENT may be turned on or turned off according to the sense signal SENSE supplied to a sense signal line SENL, which is another kind of gate line GL, and may control connection between the second node N2 of the driving transistor DRT and the reference voltage line RVL.

The sensing transistor SENT may be turned on by the sense signal SENSE having the turn-on level voltage and may deliver a reference voltage Vref supplied from the reference voltage line RVL to the second node N2 of the driving transistor DRT.

Also, the sensing transistor SENT may be turned on by the sense signal SENSE having the turn-on level voltage and may deliver the voltage of the second node N2 of the driving transistor DRT to the reference voltage line RVL.

Here, when the sensing transistor SENT is an n-type transistor, the turn-on level voltage of the sense signal SENSE may be a high level voltage. Here, when the sensing transistor SENT is a p-type transistor, the turn-on level voltage of the sense signal SENSE may be a low level voltage.

A function in which the sensing transistor SENT delivers the voltage of the second node N2 of the driving transistor DRT to the reference voltage line RVL may be used upon driving for sensing the characteristic value of the sub-pixel SP. In this case, the voltage delivered to the reference voltage line RVL may be a voltage for calculating the characteristic value of the sub-pixel SP or a voltage reflecting the characteristic value of the sub-pixel SP.

In the present disclosure, the characteristic value of the sub-pixel SP may be the characteristic value of the driving transistor DRT or the light-emitting device ED. The characteristic value of the driving transistor DRT may include the threshold voltage and mobility of the driving transistor DRT. The characteristic value of the light-emitting device ED may include the threshold voltage of the light-emitting device ED.

Each of the driving transistor DRT, the scan transistor SCT, and the sensing transistor SENT may be an n-type transistor or a p-type transistor. In the present disclosure, for convenience of description, as an example, each of the driving transistor DRT, the scan transistor SCT, and the sensing transistor SENT may be an n-type transistor.

The storage capacitor Cst may be a parasitic capacitor (e.g., Cgs or Cgd) which is an internal capacitor between the gate node and the source node (or drain node) of the driving transistor DRT or an external capacitor which is intentionally designed outside the driving transistor DRT.

The scan signal line SCL and the sensing signal line SENL may be different gate lines GL. In this case, the scan signal SCAN and the sense signal SENSE may be separate gate signals, and the on-off timing of the scan transistor SCT and the on-off timing of the sensing transistor SENT in one sub-pixel SP may be independent. That is, the on-off timing of the scan transistor SCT and the on-off timing of the sensing transistor SENT in one sub-pixel SP may be the same or different.

Alternatively, the scan signal line SCL and the sense signal line SENL may be the same gate line GL. That is, the gate node of the scan transistor SCT and the gate node of the sensing transistor SENT in one sub-pixel SP may be connected to one gate line GL. In this case, the scan signal SCAN and the sense signal SENSE may be the same gate signal, and the on-off timing of the scan transistor SCT and the on-off timing of the sensing transistor SENT in one sub-pixel SP may be the same.

The structure of the sub-pixel SP shown in FIGS. 2A and 2B is merely an example and may be variously modified by further including one or more transistors or by further including one or more capacitors.

Also, in FIGS. 2A and 2B, the sub-pixel structure is described assuming that the display device 100 is a self-luminous display device. However, when the display device 100 is a liquid crystal display device, each sub-pixel SP may include a transistor, a pixel electrode, etc.

Figure 3:
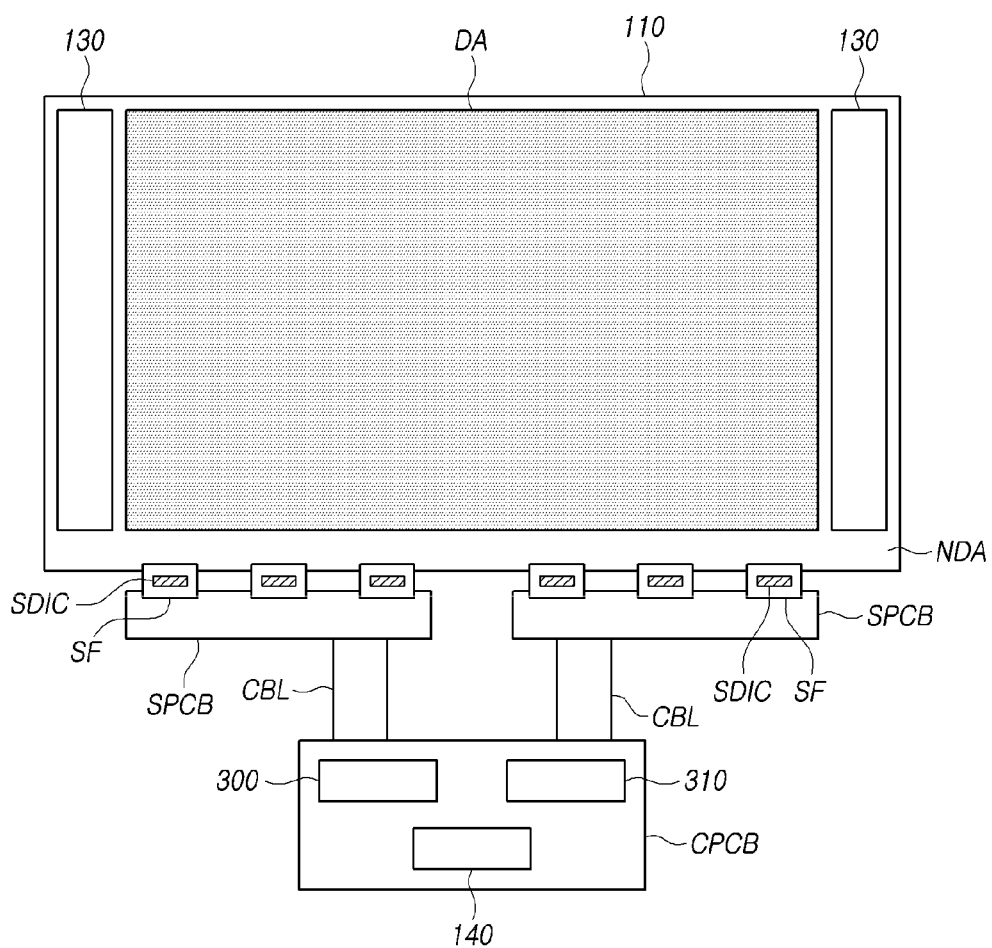
FIG. 3 illustrates a system of a display device according to embodiments of the present disclosure.

FIG. 3 shows the system of the display device 100 according to embodiments of the present disclosure.

Referring to FIG. 3, the display panel 110 may include a display area DA where images are displayed and a non-display area NDA where no images are displayed.

Referring to FIG. 3, when the data driving circuit 120 includes one or more source driver integrated circuits SDIC and is implemented in a chip-on-film (COF) method, each source driver integrated circuit SDIC may be mounted on a circuit film SF connected to the non-display area NDA of the display panel 110.

Referring to FIG. 3, the gate driving circuit 130 may be implemented as a gate-in-panel (GIP) type. In this case, the gate driving circuit 130 may be formed in the non-display area NDA of the display panel 110. Unlike FIG. 3, the gate driving circuit 130 may be implemented as a chip-on-film (COF) type.

The display device 100 may include at least one source printed circuit board SPCB and a control printed circuit board CPCB for mounting control components and various electric devices for a circuit connection between one or more source driver integrated circuits SDIC and other devices.

A film SF on which the source driver integrated circuit SDIC is mounted may be connected to the source integrated circuit board SPCB. That is, the film SF on which the source driver integrated circuit SDIC is mounted may have one side electrically connected to the display panel 110 and the other side electrically connected to the source integrated circuit board SPCB.

A controller 140, a power management integrated circuit (PMIC) 310, and the like may be mounted on the control printed circuit board CPCB. The controller 140 may perform overall control functions related to the driving of the display panel 110 and may control operations of the data driving circuit 120 and the gate driving circuit 130. The power management integrated circuit 310 may supply various voltages or currents to the data driving circuit 120, the gate driving circuit 130, and the like or may control various voltages or currents to be supplied.

The source printed circuit board SPCB and the control printed circuit board CPCB may be connected in a circuit manner through at least one connection cable CBL. Here, the connection cable CBL may be, for example, a flexible printed circuit (FPC), a flexible flat cable (FFC), etc.

The source printed circuit board SPCB and the control printed circuit board CPCB may be implemented in an integrated manner as one printed circuit board.

The display device 100 according to embodiments of the present disclosure may further include a level shifter 300 for adjusting a voltage level. For example, the level shifter 300 may be disposed on a control printed circuit board CPCB or a source printed circuit board SPCB.

In particular, in the display device 100 according to embodiments of the present disclosure, the level shifter 300 may supply signals beneficial for gate driving to the gate driving circuit 130. For example, the level shifter 300 may supply a plurality of clock signals to the gate driving circuit 130. Accordingly, the gate driving circuit 130 may output multiple gate signals to the multiple gate lines GL on the basis of the plurality of clock signals input from the level shifter 300. Here, the plurality of gate lines GL may deliver the multiple gate signals to sub-pixels SP disposed in the display area DA of the substrate SUB.

Figure 4:
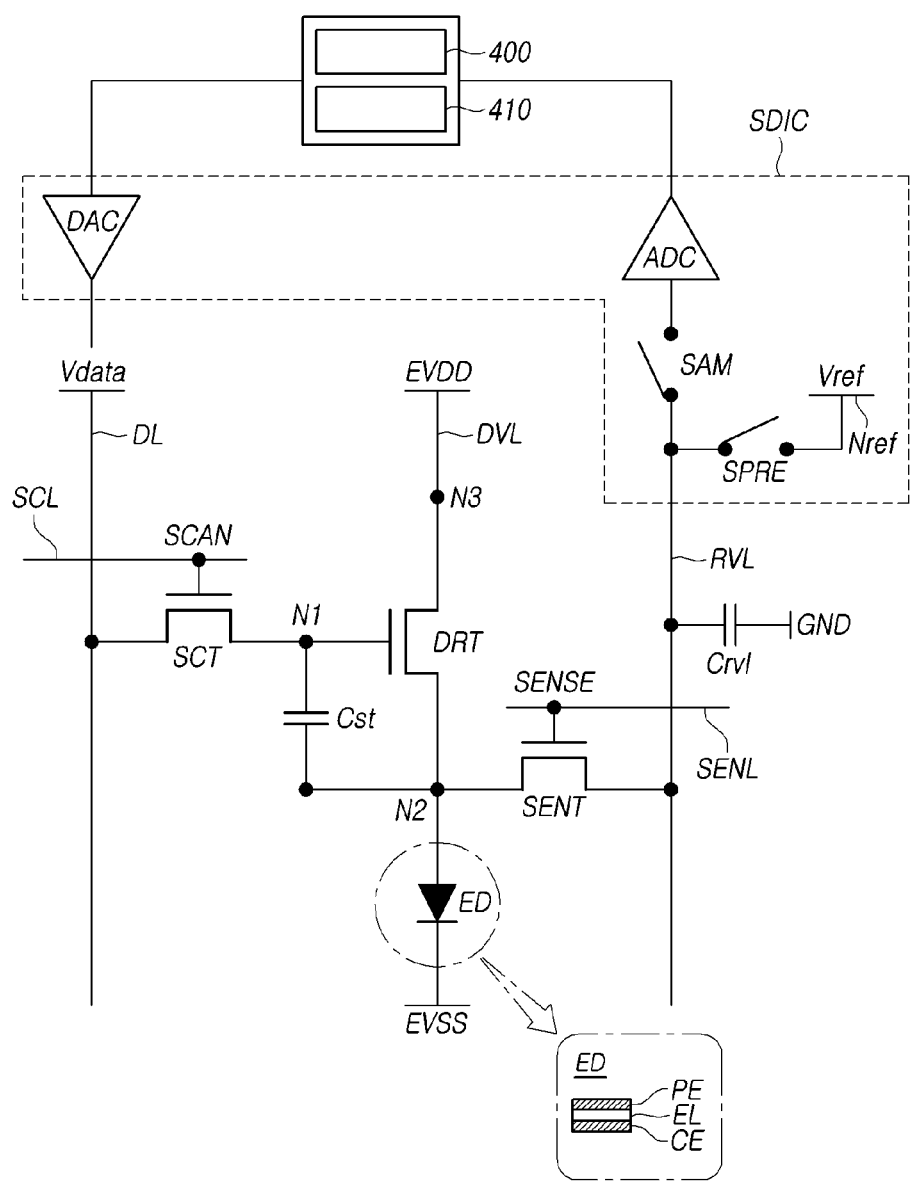
FIG. 4 illustrates a compensation circuit of a display device according to embodiments of the present disclosure.

FIG. 4 illustrates a compensation circuit of the display device 100 according to embodiments of the present disclosure.

Referring to FIG. 4, the compensation circuit is a circuit capable of sensing and compensating for the characteristic value of a circuit element in the sub-pixel SP.

The compensation circuit may be connected to the sub-pixel SP and may include a power switch SPRE, a sampling switch SAM, an analog-to-digital converter ADC, a compensator 400, etc.

The power switch SPRE may control connection between a reference voltage line RVL and a reference voltage supply node Nref. A reference voltage Vref output from a power supply device is supplied to the reference voltage supply node Nref, and the reference voltage Vref supplied to the reference voltage supply node Nref may be applied to the reference voltage line RVL through the power switch SPRE.

The sampling switch SAM may control connection between the analog-to-digital converter ADC and the reference voltage line RVL. When the analog-to-digital converter ADC is connected to the reference voltage line RVL by the sampling switch SAM, the analog-to-digital converter ADC may convert the voltage (analog voltage) of the connected reference voltage line RVL into a sensing value corresponding to a digital value.

A line capacitor Crvl may be formed between the reference voltage line RVL and the ground GND. The voltage of the reference voltage line RVL may correspond to the charge amount of the line capacitor Crvl.

The analog-to-digital converter ADC may provide sensing data including a sensing value to the compensator 400.

The compensator 400 may detect the characteristic value of the light-emitting device ED or the driving transistor DRT included in the corresponding sub-pixel SP on the basis of the sensing data and may calculate a compensation value and store the calculated compensation value in a memory 410.

For example, the compensation value, which is information for reducing a characteristic value deviation between light-emitting devices ED or a characteristic value deviation between driving transistors DRT, may include an offset and a gain value for data changes.

The display controller 140 may change image data by using the compensation value stored in the memory 410 and may supply the changed image data to the data driving circuit 120.

The data driving circuit 120 may use a digital-to-analog converter DAC to convert the changed image data into a data voltage Vdata corresponding to the analog voltage and output the converted data voltage Vdata. Accordingly, compensation can be realized.

Referring to FIG. 4, the analog-to-digital converter ADC, the power switch SPRE, and the sampling switch SAM may be included in the source driver integrated circuit SDIC included in the data driving circuit 120. The compensator 400 may be included in the display controller 140.

As described above, the display device 100 according to embodiments of the present disclosure may perform a compensation process to reduce the characteristic value deviation between the driving transistors DRT. Also, in order to perform the compensation processing, the display device 100 may perform sensing-driving to detect the characteristic value deviation between the driving transistors DRT.

The display device 100 according to embodiments of the present disclosure may perform sensing-driving in two modes (a fast mode and a slow mode). The sensing-driving in the two modes (the fast mode and the slow mode) will be described below with reference to FIGS. 5A and 5B.

Figure 5A:
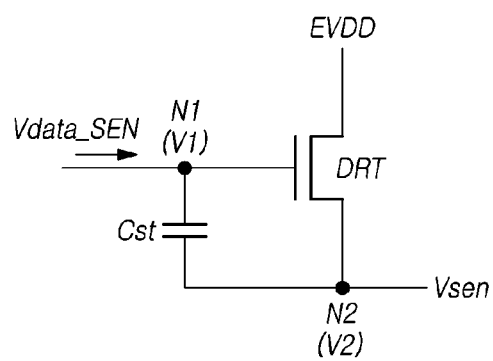
FIG. 5A is a diagram for a first sensing mode of a display device according to embodiments of the present disclosure.
Figure 5A:
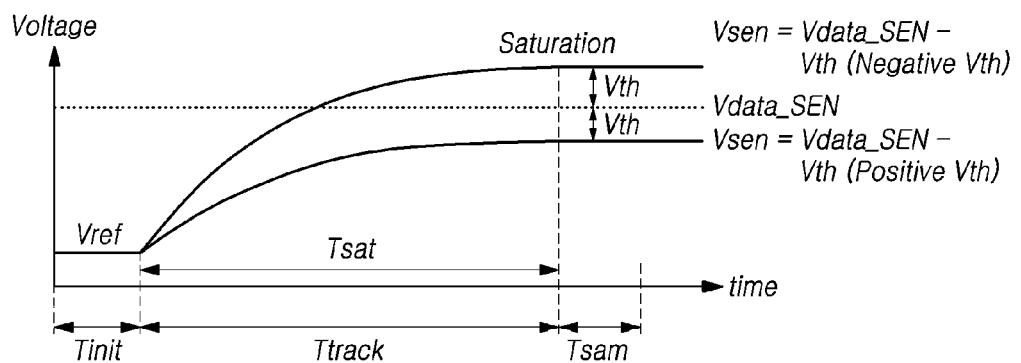
Figure 5B:
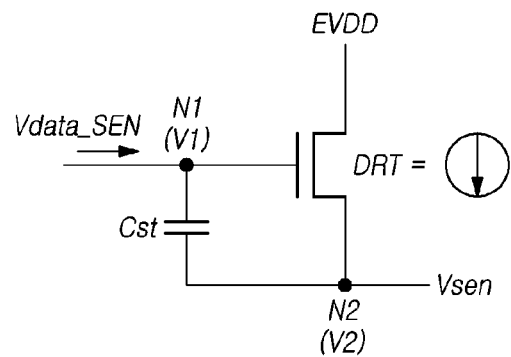
FIG. 5B is a diagram for a second sensing mode of a display device according to embodiments of the present disclosure.
Figure 5B:
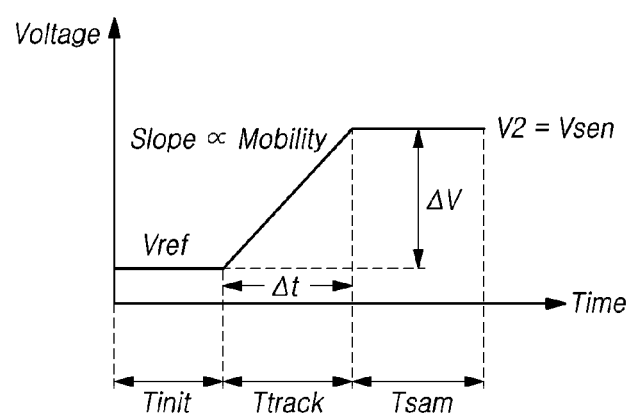

FIG. 5A is a diagram for a first sensing mode (S-Mode) of the display device 100 according to embodiments of the present disclosure. FIG. 5B is a diagram for a second sensing mode (F-Mode) of the display device 100 according to embodiments of the present disclosure.

Referring to FIG. 5A, the first sensing mode (S-mode) is a sensing-driving mode for slowly sensing a characteristic value (e.g., a threshold voltage) requiring a relatively long time among the characteristic values (e.g., a threshold voltage, mobility, etc.) of the driving transistor DRT. The first sensing mode (S-Mode) may also be referred to as a slow mode or a threshold voltage sensing mode.

Referring to FIG. 5B, the second sensing mode (F-mode) is a sensing-driving mode for quickly sensing a characteristic value (e.g., mobility) requiring a relatively short time among the characteristic values (e.g., a threshold voltage, mobility, etc.) of the driving transistor DRT. The second sensing mode (F-Mode) may also be referred to as a fast mode or a mobility sensing mode.

Referring to FIGS. 5A and 5B, each of the sensing-driving period of the first sensing mode (S-Mode) and the sensing-driving period of the second sensing mode (F-Mode) may include an initialization period Tinit, a tracking period Ttrack, and a sampling period Tsam. Each of the first sensing mode (S-Mode) and the second sensing mode (F-Mode) will be described below.

First, the sensing-driving period of the first sensing mode (S-Mode) of the display device 100 will be described with reference to FIG. 5A.

Referring to FIG. 5A, the initialization period Tinit of the sensing-driving period of the first sensing mode (S-Mode) is a period in which a first node N1 and a second node N2 of the driving transistor DRT are initialized.

During the initialization period Tinit, the voltage V1 of the first node N1 of the driving transistor DRT may be initialized to a sensing-driving data voltage Vdata_SEN, and the voltage V2 of the second node N2 of the driving transistor DRT may be initialized to a sensing-driving reference voltage Vref.

During the initialization period Tinit, the scan transistor SCT and the sense transistor SENT may be turned on, and the power switch SPRE may be turned on.

Referring to FIG. 5A, the tracking period Ttrack of the sensing-driving period of the first sensing mode (S-Mode) is a period in which the voltage V2 of the second node N2 of the driving transistor DRT that reflects the threshold voltage Vth, or a change in the threshold voltage Vth, of the driving transistor DRT is tracked.

During the tracking period Ttrack, the power switch SPRE may be turned off, or the sense transistor SENT may be turned off.

Accordingly, during the tracking period Ttrack, the first node N1 of the driving transistor DRT is in a constant voltage state having the sensing-driving data voltage Vdata_SEN, and the second node N2 of the driving transistor DRT may be in an electrically floating state. Therefore, the voltage V2 of the second node N2 of the driving transistor DRT may be varied during the tracking period Ttrack.

During the tracking period Ttrack, the voltage V2 of the second node N2 of the driving transistor DRT may increase until the voltage V2 of the second node N2 of the driving transistor DRT reflects the threshold voltage Vth of the driving transistor (DRT).

During the initialization period Tinit, the voltage difference between the first node N1 and the second node N2 of the initialized driving transistor DRT may be greater than or equal to the threshold voltage Vth of the driving transistor DRT. Accordingly, when the tracking period Ttrack starts, the driving transistor DRT is turned on to conduct a current. Accordingly, when the tracking period Ttrack starts, the voltage V2 of the second node N2 of the driving transistor DRT may increase.

During the tracking period Ttrack, the voltage V2 of the second node N2 of the driving transistor DRT does not continuously increase.

The increase width of the voltage of the second node N2 of the driving transistor DRT may decrease toward the second half of the tracking period Ttrack. Finally, the voltage V2 of the second node N2 of the driving transistor DRT may be saturated.

The saturated voltage V2 of the second node N2 of the driving transistor DRT may correspond to the difference Vdata_SEN−Vth between the data voltage Vdata_SEN and the threshold voltage Vth or the difference between the data voltage Vdata_SEN and the threshold voltage deviation ΔVth. Here, the threshold voltage Vth may be a negative threshold voltage Negative Vth or a positive threshold voltage Positive Vth.

When the voltage V2 of the second node N2 of the driving transistor DRT is saturated, the sampling period Tsam may be started.

Referring to FIG. 5A, the sampling period Tsam of the sensing-driving period of the first sensing mode (S-Mode) is a period in which the voltage Vdata_SEN−Vth or Vdata_SEN−ΔVth that reflects the threshold voltage Vth, or a change in the threshold voltage Vth, of the driving transistor DRT is measured.

The sampling period Tsam of the sensing-driving period of the first sensing mode (S-Mode) is an operation in which the analog-to-digital converter ADC senses the voltage of the reference voltage line RVL. Here, the voltage of the reference voltage line RVL may correspond to the voltage of the second node N2 of the driving transistor DRT and may correspond to the charging voltage of the line capacitor Crvl formed in the reference voltage line RVL.

During the sampling period Tsam, the voltage Vsen sensed by the analog-to-digital converter ADC may be the voltage Vdata_SEN−Vth, which is the data voltage Vdata_SEN minus the threshold voltage Vth or the voltage Vdata_SEN−ΔVth, which is the data voltage Vdata_SEN minus the threshold voltage variation ΔVth. Here, Vth may be a positive threshold voltage or a negative threshold voltage.

Referring to FIG. 5A, during the tracking period Ttrack of the sensing-driving period of the first sensing mode (S-Mode), the saturation time Tsat beneficial for the voltage V2 of the second node N2 of the driving transistor DRT to be increased and saturated may be a temporal length of the tracking period Ttrack of the sensing-driving period of the first sensing mode (S-Mode) and may be the time taken for the threshold voltage Vth, or a change in the threshold voltage Vth, of the driving transistor DRT to be reflected in the voltage V2 (=Vdata_SEN−Vth) of the second node N2 of the driving transistor DRT.

This saturation time Tsat may occupy most of the overall temporal length of the sensing-driving period of the first sensing mode (S-Mode). In the first sensing mode (S-Mode), it may take a significantly long time (saturation time Tsat) for the voltage V2 of the second node N2 of the driving transistor DRT to be increased and saturated.

As described above, the sensing-driving method for sensing the threshold voltage of the driving transistor DRT is referred to as the slow mode (the first sensing mode (S-Mode)) because a long saturation time Tsat is beneficial until the voltage state of the second node N2 of the driving transistor DRT indicates the threshold voltage of the driving transistor DRT.

The sensing-driving period of the second sensing mode (F-Mode) of the display device 100 will be described with reference to FIG. 5B.

Referring to FIG. 5B, the initialization period Tinit of the sensing-driving period of the second sensing mode (F-Mode) is a period in which the first node N1 and the second node N2 of the driving transistor DRT are initialized.

During the initialization period Tinit, the scan transistor SCT and the sense transistor SENT may be turned on, and the power switch SPRE may be turned on.

During the initialization period Tinit, the voltage V1 of the first node N1 of the driving transistor DRT may be initialized to the sensing-driving data voltage Vdata_SEN, and the voltage V2 of the second node N2 of the driving transistor DRT may be initialized to the sensing-driving reference voltage Vref.

Referring to FIG. 5B, the tracking period Ttrack of the sensing-driving period of the second sensing mode (F-Mode) is a period in which the voltage V2 of the second node N2 of the driving transistor DRT is changed for a preset tracking time Δt until the voltage V2 of the second node N2 of the driving transistor DRT reaches a voltage state that reflects the mobility or mobility change of the driving transistor DRT.

During the tracking period Ttrack, the preset tracking time Δt may be set to be short. Therefore, during the short tracking time Δt, it is difficult for the voltage V2 of the second node N2 of the driving transistor DRT to reflect the threshold voltage Vth. However, during the short tracking time Δt, the voltage V2 of the second node N2 of the driving transistor DRT may be varied enough to detect the mobility of the driving transistor DRT.

Accordingly, the second sensing mode (F-Mode) is a sensing-driving method for sensing the mobility of the driving transistor DRT.

During the tracking period Ttrack, the second node N2 of the driving transistor DRT may be electrically floating as the power switch SPRE is turned off or the sense transistor SENT is turned off.

During the tracking period Ttrack, the scan transistor SCT may be turned off by the scan signal SCAN of the turn-off level voltage, and the first node N1 of the driving transistor DRT may be floating.

During the initialization period Tinit, the voltage difference between the first node N1 and the second node N2 of the initialized driving transistor DRT may be greater than or equal to the threshold voltage Vth of the driving transistor DRT. Accordingly, when the tracking period Ttrack starts, the driving transistor DRT is turned on to conduct a current.

Here, when the first node N1 and the second node N2 of the driving transistor DRT are a gate node and a source node, respectively, the voltage difference between the first node N1 and the second node N2 of the driving transistor DRT is Vgs.

Therefore, the voltage V2 of the second node N2 of the driving transistor DRT may increase during the tracking period Ttrack. In this case, the voltage V1 of the first node N1 of the driving transistor DRT may also increase.

During the tracking period Ttrack, the increasing rate of the voltage V2 of the second node N2 of the driving transistor DRT varies depending on the electric current capability (i.e., mobility) of the driving transistor DRT. As the electric current capability (mobility) of the driving transistor DRT increases, the voltage V2 of the second node N2 of the driving transistor DRT may increase more steeply.

After the tracking period Ttrack proceeds for the preset tracking time Δt, that is, after the voltage V2 of the second node N2 of the driving transistor DRT increases during the preset tracking time Δt, the sampling period Tsam may begin.

During the tracking period Ttrack, the increasing rate of the voltage V2 of the second node N2 of the driving transistor DRT corresponds to the voltage variation ΔV of the second node N2 of the driving transistor DRT during the preset tracking time Δt. Here, the voltage variation ΔV of the second node N2 of the driving transistor DRT may correspond to the voltage variation of the reference voltage line RVL.

Referring to FIG. 5B, when the tracking period Ttrack proceeds for the preset tracking time Δt, the sampling period Tsam may begin. During the sampling period Tsam, the sampling switch SAM may be turned on, and thus the reference voltage line RVL and the analog-to-digital converter ADC may be electrically connected.

The analog-to-digital converter ADC may sense the voltage of the reference voltage line RVL. The voltage Vsen sensed by the analog-to-digital converter ADC may be a voltage Vref+ΔV, which is increased from the reference voltage Vref by the voltage variation ΔV during a certain tracking time Δt.

The voltage Vsen sensed by the analog-to-digital converter ADC may be the voltage of the reference voltage line RVL and may be the voltage of the second node N2 electrically connected to the reference voltage line RVL through the sense transistor SENT.

Referring to FIG. 5B, during the sampling period Tsam of the sensing-driving period of the second sensing mode (F-Mode), the voltage Vsen sensed by the analog-to-digital converter ADC may vary depending on the mobility of the driving transistor DRT. The sensing voltage Vsen increases as the driving transistor DRT has higher mobility. The sensing voltage Vsen decreases as the driving transistor DRT has lower mobility.

As described above, the sensing-driving method for sensing the mobility of the driving transistor DRT is referred to as the fast mode (the second sensing mode (F-Mode)) because the voltage of the second node N2 of the driving transistor DRT needs to be changed only for a short time Δt.

Referring to FIG. 5A, the display device 100 according to embodiments of the present disclosure may detect the threshold voltage Vth, or a change in the threshold voltage Vth, of the driving transistor DRT in the corresponding sub-pixel SP on the basis of the voltage Vsen sensed through the first sensing mode (S-Mode), calculate a threshold voltage compensation value for reducing or removing the threshold voltage variation between the driving transistors DRT, and store the calculated threshold voltage compensation value in the memory 410.

Referring to FIG. 5B, the display device 100 according to embodiments of the present disclosure may detect the mobility, or a change in the mobility, of the driving transistor DRT in the corresponding sub-pixel SP on the basis of the voltage Vsen sensed through the second sensing mode (F-Mode), calculate a mobility compensation value for reducing or removing the mobility variation between the driving transistors DRT, and store the calculated mobility compensation value in the memory 410.

The display device 100 may supply the data voltage Vdata changed by the threshold voltage compensation value and the mobility compensation value when supplying the data voltage Vdata for display driving to the corresponding sub-pixel SP.

As described above, the threshold voltage sensing may proceed in the first sensing mode (S-Mode) due to a characteristic in which the threshold voltage sensing benefits from a long sensing time, and the mobility sensing may proceed in the second sensing mode (F-Mode) due to a characteristic in which a short sensing time is sufficient for the mobility sensing.

Figure 6:
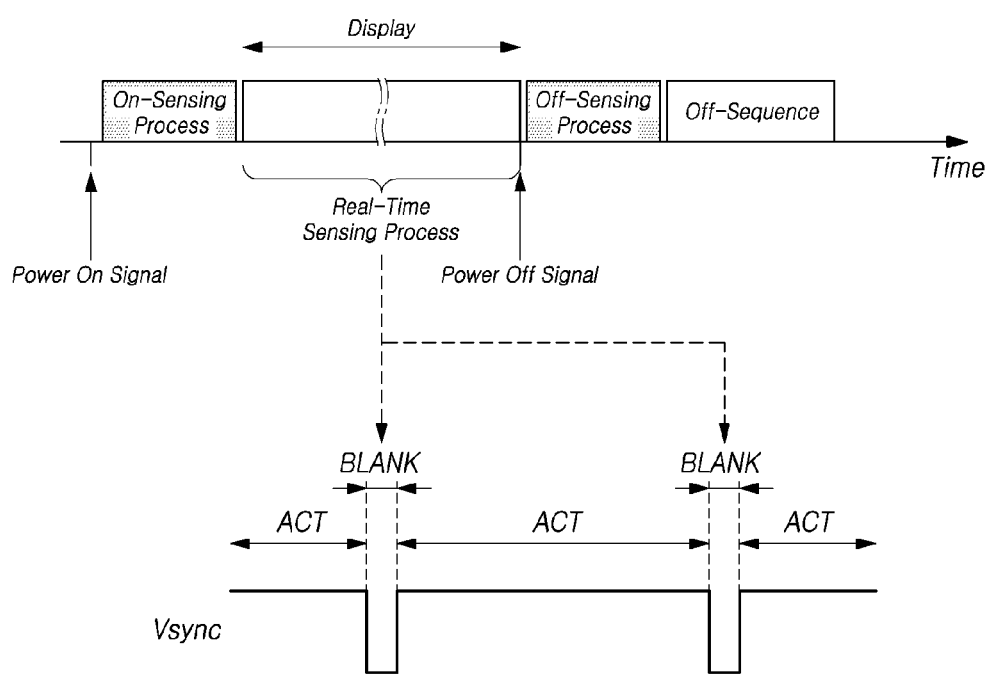
FIG. 6 is a diagram illustrating various sensing timings of a display device according to embodiments of the present disclosure.

FIG. 6 is a diagram illustrating various sensing timings of the display device 100 according to embodiments of the present disclosure.

Referring to FIG. 6, when a power-on signal is generated, the display device 100 according to embodiments of the present disclosure may sense the characteristic value of the driving transistor DRT in each sub-pixel SP disposed in the display panel 110. The sensing process is referred to as an on-sensing process.

Referring to FIG. 6, when a power-off signal is generated, the display device 100 according to embodiments of the present disclosure may sense the characteristic value of the driving transistor DRT in each sub-pixel SP disposed in the display panel 110 before an off-sequence such as power-off. The sensing process is referred to as an off-sensing process.

Referring to FIG. 6, until the power-off signal is generated after the power-on signal is generated, the display device 100 according to embodiments of the present disclosure may sense the characteristic value of the driving transistor DRT in each sub-pixel SP while the display is driven. The sensing process is referred to as a real-time sensing process.

The real-time sensing process may be performed every blank time BLANK between active times ACT based on a vertical synchronization signal Vsync.

Since the mobility sensing of the driving transistor DRT may be accomplished in a short time, the mobility sensing may be performed in the second sensing mode (F-Mode) among the sensing-driving methods.

Since the mobility sensing that may be performed in the second sensing mode (F-Mode), which is the fast mode, and may be accomplished in a short time, the mobility sensing may be performed in one of an on-sensing process, an off-sensing process, and a real-time sensing process.

For example, the mobility sensing that may be performed in the second sensing mode (F-Mode), which is the fast mode, may be performed as a real-time sensing process capable of reflecting a change in the mobility in real time while the display is driven. That is, the mobility sensing may be performed every blank period while the display is driven.

In contrast, the threshold voltage sensing of the driving transistor DRT benefits from a long saturation time Vsat. Therefore, the threshold voltage sensing may be performed in the first sensing mode (S-Mode) among the sensing-driving methods.

The threshold voltage sensing should be performed using a timing that does not interfere with user viewing. Therefore, the threshold voltage sensing of the driving transistor DRT may be performed while the display is not driven (i.e., in a situation in which a user does not intend to view the display) after the power-off signal is generated according to a user input or the like. That is, the threshold voltage sensing may be performed as an off-sensing process.

Figure 7:
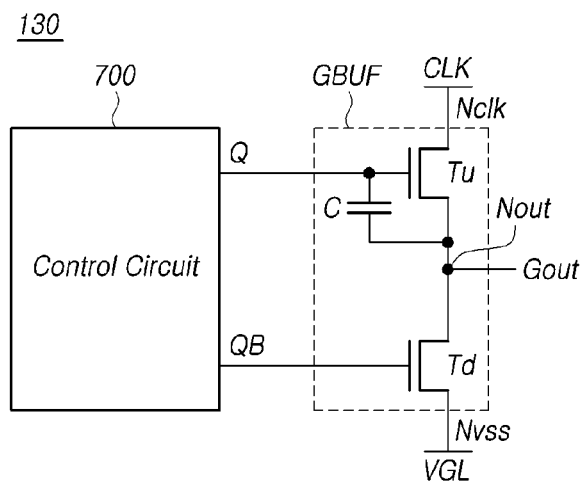
FIG. 7 is a diagram schematically illustrating a gate driving circuit of a display device according to embodiments of the present disclosure.

FIG. 7 is a diagram schematically illustrating the gate driving circuit 130 of the display device 100 according to embodiments of the present disclosure.

Referring to FIG. 7, the gate driving circuit 130 according to embodiments of the present disclosure may include multiple gate output circuits G-BUF for outputting multiple gate signals Gout and a control circuit 700 for controlling the multiple gate output circuits G-BUF. Here, each of the multiple gate signals Gout may be a scan signal SCAN or a sense signal SENSE.

Each of the multiple gate output circuits G-BUF may receive a clock signal CLK and a low level voltage VGL and output the gate signal Gout to a gate output node Nout.

The gate output circuit G-BUF may include a pull-up transistor Tu into which the clock signal CLK is input and a pull-down transistor Td into which the low level voltage is input.

The gate output circuit G-BUF may output the gate signal Gout to the gate output node Nout to which the pull-up transistor Tu and the pull-down transistor Td are connected.

The pull-up transistor Tu may be connected between a clock signal input node Nclk and the gate output node Nout and may switch connection between the clock signal input node Nclk and the gate output node Nout.

The pull-down transistor Td may be connected between a low level voltage node Nvss and the gate output node Nout and may be configured to switch connection between the low level voltage node Nvss and the gate output node Nout.

In the pull-up transistor Tu, a capacitor C may be electrically connected between the gate output node Nout and a Q node, which is a gate node. The capacitor C may serve to boost the voltage of the Q node according to the variation of the voltage of the gate output node Nout.

The control circuit 700 may control the voltage of the Q node electrically connected to the gate node of the pull-up transistor Tu and control the voltage of a QB node electrically connected to the gate node of the pull-down transistor Td. Here, through the transistor, the QB node may receive a DC voltage and receive an AC signal.

The control circuit 700 may include multiple transistors in order to control the voltage of each of the Q node and the QB node. For example, the control circuit 700 may include one or more transistors for charging the Q node, one or more transistors for discharging the Q node, one or more transistors for charging the QB node, and one or more transistors for discharging the QB node.

In order to control the voltage of each of the Q node and the QB node, the control circuit 700 may receive a start signal, a reset signal, and the like and further receive a carry signal according to the gate driving method.

Figure 8:
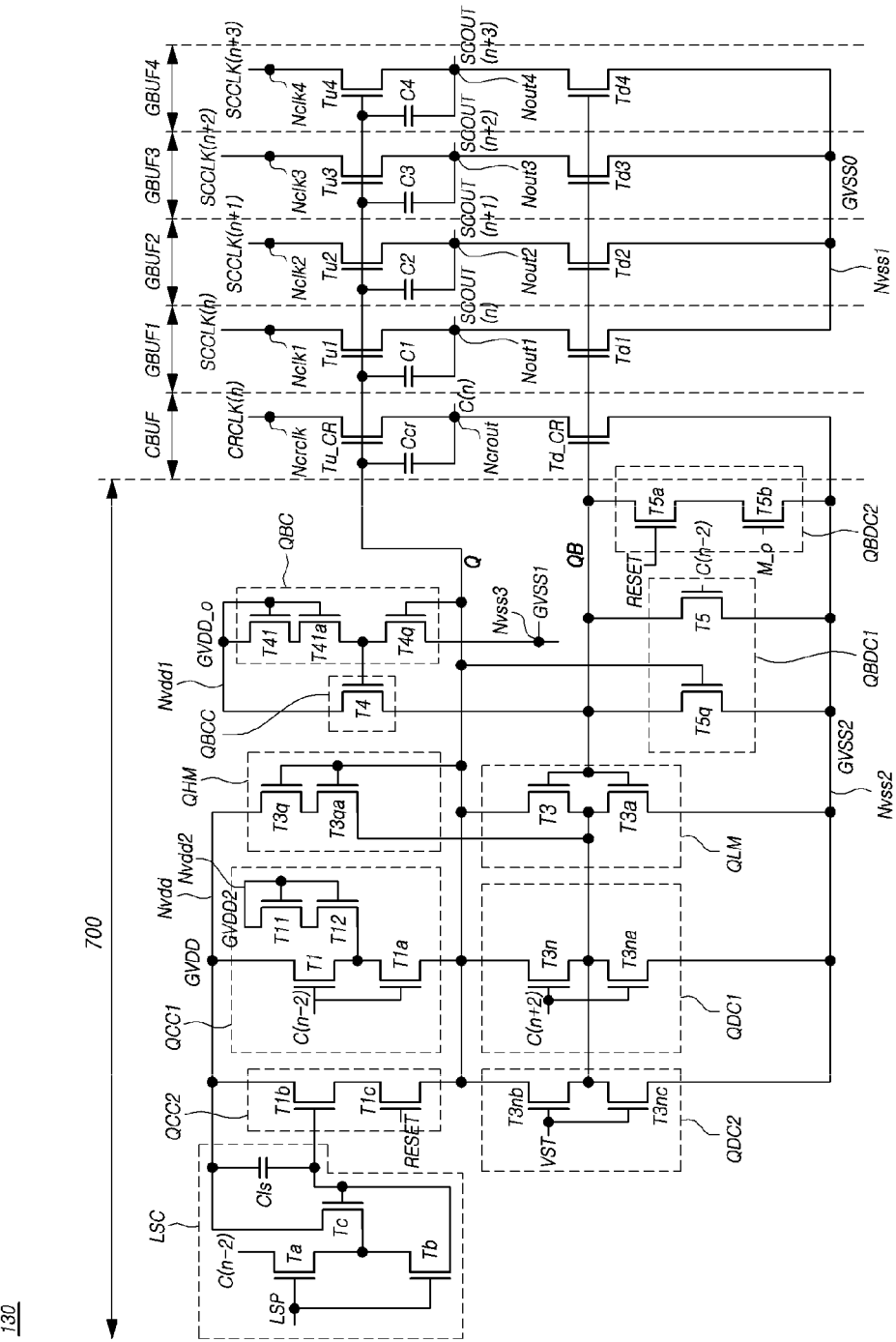
FIG. 8 illustrates a gate driving circuit included in a display device according to embodiments of the present disclosure when the display device has a sensing function.
Figure 9:
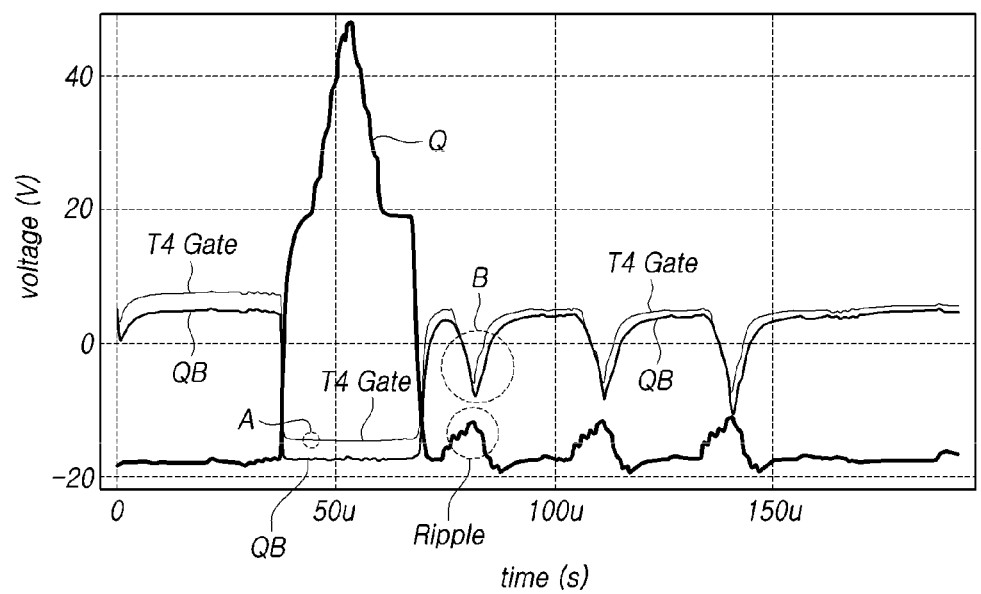
FIG. 9 illustrates voltage waveforms at main nodes in a gate driving circuit of FIG. 8.

FIG. 8 shows the gate driving circuit 130 included in the display device 100 when the display device 100 has a sensing function according to embodiments of the present disclosure, and FIG. 9 shows voltage waveforms at main nodes (the Q node, the QB node, and the T4 gate) in the gate driving circuit 130 of FIG. 8. However, the gate driving circuit 130 shown in FIG. 8 is a partial stage circuit of the entire gate driving circuit 130.

Referring to FIG. 8, the gate driving circuit 130 according to embodiments of the present disclosure may include a first gate output buffer circuit GBUF1 and the control circuit 700.

Referring to FIG. 8, the first gate output buffer circuit GBUF1 may include a first pull-up transistor Tu1 and a first pull-down transistor Td1.

The control circuit 700 may control the voltage of the Q node electrically connected to the gate node of the first pull-up transistor Tu1 and the voltage of the QB node electrically connected to the gate node of the first pull-down transistor Td1.

The first pull-up transistor Tu1 may be connected between a first clock signal input node Nclk1 and a first gate output node Nout1. The first pull-down transistor Td1 may be connected between the first gate output node Nout1 and a first low level voltage node Nvss1.

Here, a first clock signal SCCLK(n) may be input to the first clock signal input node Nclk1. A first level voltage GVSS0 may be applied to the first low level voltage node Nvss1.

The first gate output buffer circuit GBUF1 may output a first gate signal SCOUT(n) to a first gate line GL through the first gate output node Nout1.

A capacitor C1 may be connected between the first gate output node Nout1 and the gate node of the first pull-up transistor Tu1.

Referring to FIG. 8, when the display device 100 according to embodiments of the present disclosure has a sensing function (e.g., a mobility sensing function), the control circuit 700 included in the gate driving circuit 130 according to embodiments of the present disclosure may include a line selection circuit LSC, Q charging circuits QCC1 and QCC2 for charging Q nodes, Q discharging circuits QDC1 and QDC2 for discharging Q nodes, holding circuits QHM and QLM for stably holding the voltage state of Q nodes, a QB charging circuit QBCC for charging QB nodes, QB discharging circuits QBDC1 and QBDC2 for discharging QB nodes, a QB control circuit QBC, etc.

Referring to FIG. 8, the line selection circuit LSC may include two main selection transistors Ta and Tb, one sub-selection transistor Tc, and one selection capacitor Cls. The line selection circuit LSC may be a circuit for selecting a corresponding sub-pixel line as a line in which the sensing-driving is performed.

The line selection signal LSP may be applied in common to the gate nodes of the two main selection transistors Ta and Tb. The line selection signal LSP, which is a pulse signal, may be applied in common to the gate nodes of the two main selection transistors Ta and Tb in the middle of a frame.

The source node (or the drain node) of the main selection transistor Ta, which is one of the two main selection transistors Ta and Tb, may be electrically connected to the drain node (or the source node) of the main selection transistor Tb, which is the other one.

The previous carry signal C(n−2) may be applied to the drain node (or the source node) of the main selection transistor Ta, which is one of the two main selection transistors Ta and Tb.

One sub-selection transistor Tc may be connected between the connection node of the two main selection transistors Ta and Tb and a second driving voltage node Nvdd. Here, a second driving voltage GVDD may be applied to the second driving voltage node Nvdd.

The source node (or the drain node) of the main selection transistor Tb, which is the other one of the two main selection transistors Ta and Tb, may be electrically connected to the gate node of the sub-selection transistor Tc.

One selection capacitor Cls may be connected between the gate node and the drain node (or the source node) of the sub-selection transistor Tc.

Referring to FIG. 8, the Q charging circuits QCC1 and QCC2 for charging Q nodes may include a first Q charging circuit QCC1 and a second Q charging circuit QCC2.

Referring to FIG. 8, the first Q charging circuit QCC1 may be connected between the second driving voltage node Nvdd and the Q node. The first Q charging circuit QCC1 may be a charging circuit for a Q node that operates upon normal display driving for displaying images during an active period. The first Q charging circuit QCC1 may be configured to supply the second driving voltage GVDD to the Q node during the active period.

Referring to FIG. 8, the second Q charging circuit QCC2 may be connected between the second driving voltage node Nvdd and the Q node. The second Q charging circuit QCC2 may be a charging circuit for a Q node that operates upon sensing-driving during a blank period. The second Q charging circuit QCC2 may be configured to supply the second driving voltage GVDD to the Q node during the blank period.

Referring to FIG. 8, the first Q charging circuit QCC1 may include two first Q charging transistors T1 and T1a connected between the second driving voltage node NVdd and the Q node. Here, the second driving voltage GVDD may be applied to the second driving voltage node Nvdd.

The gate nodes of the two first Q charging transistors T1 and T1a may be electrically connected to each other. The previous carry signal C(n−2) may be input to the gate nodes of the two first Q charging transistors T1 and T1a.

The source node (or the drain node) of the first Q charging transistor T1, which is one of the two first Q charging transistors T1 and T1a, may be electrically connected to the drain node (or the source node) of the first Q charging transistor T1a, which is the other one. The drain node (or the source node) of the first Q charging transistor T1 may be electrically connected to the second driving voltage node Nvdd. The source node (or the drain node) of the first Q charging transistor T1a may be electrically connected to the Q node.

The first Q charging circuit QCC1 may further include two first additional charging transistors T11 and T12 connected between a third driving voltage node Nvdd2 and the connection node of the two first Q charging transistors T1 and T1a.

The gate nodes of the two first additional charging transistors T11 and T12 may be connected in common to the third driving voltage node Nvdd2. Here, the third driving voltage GVDD2 may be applied to the third driving voltage node Nvdd2.

The source node (or the drain node) of the first additional charging transistor T11, which is one of the two first additional charging transistors T11 and T12, may be electrically connected to the drain node (or the source node) of the first additional charging transistor T12.

The drain node (or the source node) of the first additional charging transistor T12 may be electrically connected to the connection node of the two first Q charging transistors T1 and T1a.

The first additional charging transistor T11 may be in a diode connection state in which the gate node and the drain node are electrically connected.

Referring to FIG. 8, the second Q charging circuit QCC2 may include two second Q charging transistors T1b and T1c connected between the second driving voltage node NVdd and the Q node.

In the second Q charging circuit QCC2, the source node (or the drain node) of the second Q charging transistor T1b, which is one of the two second Q charging transistors T1b and T1c may be electrically connected to the drain node (or the source node) of the second Q charging transistor T1c, which is the other one.

The drain node (or the source node) of the second Q charging transistor T1b may be electrically connected to the second driving voltage node Nvdd. The selection capacitor Cls of the line selection circuit LSC may be connected between the gate node and the drain node (or the source node) of the second Q charging transistor T1b.

A reset signal RESET may be applied to the gate node of the second Q charging transistor T1c. The source node (or the drain node) of the second Q charging transistor T1c may be electrically connected to the Q node.

Referring to FIG. 8, the Q discharging circuits QDC1 and QDC2 for discharging Q nodes may include a first Q discharging circuit QDC1 and a second Q discharging circuit QDC2.

Referring to FIG. 8, the first Q discharging circuit QDC1 may be connected between a second low level voltage node Nvss2 and the Q node. The first Q discharging circuit QDC1 may be a discharging circuit for a Q node that operates upon normal display driving for displaying images during an active period. The first Q discharging circuit QDC1 may be configured to supply the second low level voltage GVSS2 to the Q node during the active period.

Referring to FIG. 8, the second Q discharging circuit QDC2 may be connected between the second low level voltage node Nvss2 and the Q node. The second Q discharging circuit QDC2 may be a discharging circuit for a Q node that operates upon sensing-driving during a blank period. The second Q discharging circuit QDC2 may be configured to supply the second low level voltage GVSS2 to the Q node during the blank period.

Referring to FIG. 8, the first Q discharging circuit QDC1 may include two first Q discharging transistors T3n and T3na connected between the second low level voltage node Nvss2 and the Q node.

The source node (or the drain node) of the first Q discharging transistor T3n, which is one of the two first Q discharging transistors T3n and T3na, may be electrically connected to the drain node (or the source node) of the first Q discharging transistor T3na, which is the other one.

The next carry signal C(n+2) may be applied in common to the gate nodes of the two first Q discharging transistors T3n and T3na.

The drain node (or the source node) of the first Q discharging transistor T3n, which is one of the two first Q discharging transistors T3n and T3na, may be electrically connected to the Q node, and the source node (or the drain node) of the first Q discharging transistor T3na, which is the other one, may be electrically connected to the second low level voltage node Nvss2. Here, a second low level voltage GVSS2 may be applied to the second low level voltage node Nvss2.

Referring to FIG. 8, the second Q discharging circuit QDC2 may include two second Q discharging transistors T3nb and T3nc connected between the second low level voltage node Nvss2 and the Q node.

The source node (or the drain node) of the second Q discharging transistor T3nb, which is one of the two second Q discharging transistors T3nb and T3nc, may be electrically connected to the drain node (or the source node) of the second Q discharging transistor T3nc, which is the other one.

A start signal VST may be applied in common to the gate nodes of the two second Q discharging transistors T3nb and T3nc.

The drain node (or the source node) of the second Q discharging transistor T3nb, which is one of the two second Q discharging transistors T3nb and T3nc, may be electrically connected to the Q node, and the source node (or the drain node) of the second Q discharging transistor T3nc, which is the other one, may be electrically connected to the second low level voltage node Nvss2.

The connection node of the two second Q discharging transistors T3nb and T3nc may be electrically connected to the connection node of the two first Q discharging transistors T3n and T3na.

Referring to FIG. 8, holding circuits QHM and QLM, which are circuits for stably holding the voltage state of the Q node, may include a first holding circuit QHM and a second holding circuit QLM.

Referring to FIG. 8, the first holding circuit QHM is a circuit for stably holding the voltage of the Q node in a high level voltage state, and the second holding circuit QLM is a circuit for stably holding the voltage of the Q node in a low level voltage state.

The holding circuit QLM may include two second holding transistors T3 and T3a connected between the second low level voltage node Nvss2 and the Q node.

The gate nodes of the two second holding transistors T3 and T3a may be connected in common to the QB node.

The source node (or the drain node) of the second holding transistor T3, which is one of the two second holding transistors T3 and T3a, may be electrically connected to the drain node (or the source node) of the second holding transistor T3a, which is the other one.

The drain node (or the source node) of the second holding transistor T3, which is one of the two second holding transistors T3 and T3a, may be electrically connected to the Q node, and the source node (or the drain node) of the second holding transistor T3a, which is the other one, may be electrically connected to the second low level voltage node Nvss2.

The connection node of the two second holding transistors T3 and T3a may be electrically connected to the connection node of the two second Q discharging transistors T3nb and T3nc and the connection node of the two first Q discharging transistors T3n and T3na.

The first holding circuit QHM may include two first holding transistors T3q and T3qa connected between the second driving voltage node Nvdd and the connection node of the two second holding transistors T3 and T3a.

The gate nodes of the two first holding transistors T3q and T3qa may be connected in common to the Q node.

The source node (or the drain node) of the first holding transistor T3q, which is one of the two first holding transistors T3q and T3qa, may be electrically connected to the drain node (or the source node) of the first holding transistor T3qa, which is the other one.

The drain node (or the source node) of the first holding transistor T3q, which is one of the two first holding transistors T3q and T3qa, may be electrically connected to the second driving voltage node Nvdd, and the source node (or the drain node) of the first holding transistor T3qa, which is the other, may be electrically connected to the connection node of the two second holding transistors T3 and T3a.

Referring to FIG. 8, a QB charging circuit QBCC for charging QB nodes may be connected between a first driving voltage node Nvdd1 and the QB node. Here, a first driving voltage GVDD_o may be applied to the first driving voltage node Nvdd1.

Referring to FIG. 8, the QB charging circuit QBCC may be configured to supply a first driving voltage GVDD_o to the QB node. The QB charging circuit QBCC may include a QB charging transistor T4 between the first driving voltage node Nvdd1 and the QB node.

The gate node of the QB charging transistor T4 may be connected to the QB control circuit QBC. The drain node (or the source node) of the QB charging transistor T4 may be electrically connected to the first driving voltage node Nvdd1. The source node (or the drain node) of the QB charging transistor T4 may be electrically connected to the QB node.

The drain node (or the source node) of the QB charging transistor T4 may be connected to the QB control circuit QBC.

Referring to FIG. 8, QB discharging circuits QBDC1 and QBDC2 for discharging QB nodes may include a first QB discharging circuit QBDC1 and a second QB discharging circuit QBDC2.

Referring to FIG. 8, the first QB discharging circuit QBDC1 may be connected between the second low level voltage node Nvss2 and the QB node. The first QB discharging circuit QBDC1 may be a discharging circuit for a QB node that operates upon normal display driving for displaying images during an active period. The first QB discharging circuit QBDC1 may be configured to supply the second low level voltage GVSS2 to the QB node during the active period.

Referring to FIG. 8, the second QB discharging circuit QBDC2 may be connected between the second low level voltage node Nvss2 and the QB node. The second QB discharging circuit QBDC2 may be a discharging circuit for a QB node that operates upon sensing-driving during a blank period. The second QB discharging circuit QBDC2 may be configured to supply the second low level voltage GVSS2 to the QB node during the blank period.

The second QB discharging circuit QBDC2 may include two second Q discharging transistors T5a and T5b connected between the second low level voltage node Nvss2 and the QB node.

The source node (or the drain node) of the second Q discharging transistor T5a, which is one of the two second Q discharging transistors T5a and T5b, may be electrically connected to the drain node (or the source node) of the second Q discharging transistor T5b, which is the other one.

The drain node (or the source node) of the second Q discharging transistor T5a, which is one of the two second Q discharging transistors T5a and T5b, may be electrically connected to the QB node, and the source node (or the drain node) of the second Q discharging transistor T5b, which is the other one, may be electrically connected to the second low level voltage node Nvss2.

A reset signal RESET may be applied to the gate node of the second Q discharging transistor T5a, which is one of the two second Q discharging transistors T5a and T5b, and a discharging control signal M_o may be applied to the gate node of the second Q discharging transistor T5b, which is the other one.

Referring to FIG. 8, the first QB discharging circuit QBDC1 may include two first Q discharging transistors T5 and T5q connected in parallel between the second low level voltage node Nvss2 and the QB node.

In the first Q discharging transistor T5, which is one of the two first Q discharging transistors T5 and T5q, a source node (or a drain node) may be connected to the second low level voltage node Nvss2, a drain node (or a source node) may be connected to the QB node, and the previous carry signal C(n−2) may be input to a gate node.

In the first Q discharging transistor T5q, which is the other one of the two first Q discharging transistors T5 and T5q, a source node (or a drain node) may be connected to the second low level voltage node Nvss2, a drain node (or a source node) may be connected to the QB node, and a gate node may be electrically connected to the Q node.

Referring to FIG. 8, the QB control circuit QBC is a circuit for controlling the QB charging circuit QBCC for charging QB nodes.

Referring to FIG. 8, the QB control circuit QBC may control the gate node of the QB charging transistor T4 included in the QB charging circuit QBCC.

The QB control circuit QBC may include first control transistors T41 and T41a connected between the gate node of the QB charging transistor T4 and the first driving voltage node Nvdd1 and a second control transistor T4q connected between the gate node of the QB charging transistor T4 and a third low level voltage node Nvss3. Here, a third low level voltage GVSS1 may be applied to the third low level voltage node Nvss3.

In the QB control circuit QBC, the gate nodes of the first control transistors T41 and T41a may be electrically connected to the first driving voltage node Nvdd1, and the gate node of the second control transistor T4q may be electrically connected to the Q node.

Referring to FIG. 8, the gate driving circuit 130 may further include a carry output buffer circuit CBUF including a carry pull-up transistor Tu_CR and a carry pull-down transistor Td_CR.

The carry pull-up transistor Tu_CR may be connected between a carry clock signal input node Ncrclk and a carry output node Ncrout. The carry pull-down transistor Td_CR may be connected between the carry output node Ncrout and the second low level voltage node Nvss2.

The gate node of the carry pull-up transistor Tu_CR may be connected to the Q node. The gate node of the carry pull-down transistor Td_CR may be connected to the QB node.

A capacitor Ccr may be connected between the gate node and the source node (or the drain node) of the carry pull-up transistor Tu_CR.

The carry output buffer circuit CBUF may output a carry signal C(n) to the previous stage circuit and/or the next stage circuit through the carry output node Ncrout.

Referring to FIG. 8, the gate driving circuit 130 according to embodiments of the present disclosure may further include a second gate output buffer circuit GBUF2.

The second gate output buffer circuit GBUF2 may include a second pull-up transistor Tu2 and a second pull-down transistor Td2.

The second pull-up transistor Tu2 may be connected between a second clock signal input node Nclk2 and a second gate output node Nout2. The second pull-down transistor Td2 may be connected between the second gate output node Nout2 and the first low level voltage node Nvss1.

Here, a second clock signal SCCLK(n+1) may be input to the second clock signal input node Nclk2. A second gate line GL may be electrically connected to the second gate output node Nout2.

A capacitor C2 may be connected between the second gate output node Nout2 and the gate node of the second pull-up transistor Tu2.

The second gate output buffer circuit GBUF2 may output a second gate signal SCOUT(n+1) to a second gate line GL through the second gate output node Nout2.

Referring to FIG. 8, the gate driving circuit 130 according to embodiments of the present disclosure may further include a third gate output buffer circuit GBUF3.

The third gate output buffer circuit GBUF3 may include a third pull-up transistor Tu3 and a third pull-down transistor Td3.

The third pull-up transistor Tu3 may be connected between a third clock signal input node Nclk3 and a third gate output node Nout3. The third pull-down transistor Td3 may be connected between the third gate output node Nout3 and the first low level voltage node Nvss1.

Here, a third clock signal SCCLK(n+2) may be input to the third clock signal input node Nclk3. A third gate line GL may be electrically connected to the third gate output node Nout3.

A capacitor C3 may be connected between the third gate output node Nout3 and the gate node of the third pull-up transistor Tu3.

The third gate output buffer circuit GBUF3 may output a third gate signal SCOUT(n+2) to the third gate line GL through the third gate output node Nout3.

Referring to FIG. 8, the gate driving circuit 130 according to embodiments of the present disclosure may further include a fourth gate output buffer circuit GBUF4.

The fourth gate output buffer circuit GBUF4 may include a fourth pull-up transistor Tu4 and a fourth pull-down transistor Td4.

The fourth pull-up transistor Tu4 may be connected between a fourth clock signal input node Nclk4 and a fourth gate output node Nout4. The fourth pull-down transistor Td4 may be connected between the fourth gate output node Nout4 and the first low level voltage node Nvss1.

Here, a fourth clock signal SCCLK(n+3) may be input to the fourth clock signal input node Nclk4. A fourth gate line GL may be electrically connected to the fourth gate output node Nout4.

A capacitor C3 may be connected between the fourth gate output node Nout4 and the gate node of the fourth pull-up transistor Tu4.

The fourth gate output buffer circuit GBUF4 may output a fourth gate signal SCOUT(n+3) to the fourth gate line GL through the fourth gate output node Nout4.

Referring to FIG. 9, in the gate driving circuit 130, the voltage level of the Q node and the voltage level of the QB node are opposite to each other. When the voltage of the Q node is in the high level voltage state, the voltage of the QB node is in the low level voltage state. When the voltage of the Q node is in the low level voltage state, the voltage of the QB node is in the high level voltage state.

Referring to FIG. 9, the voltage change of the QB node may correspond to the voltage change of the gate node T4 Gate of the QB charging transistor T4 included in the QB charging circuit QBCC.

The voltage of the gate node T4 Gate of the QB charging transistor T4 may decrease when the voltage of the QB node decreases. The voltage of the gate node T4 Gate of the QB charging transistor T4 may increase when the voltage of the QB node increases.

The voltage of the gate node T4 Gate of the QB charging transistor T4 may be in the high level voltage state when the voltage of the QB node is in the high level voltage state. The voltage of the gate node T4 Gate of the QB charging transistor T4 may be in the low level voltage state when the voltage of the QB node is in the low level voltage state.

Referring to FIG. 9, when the threshold voltage of the second control transistor T4q included in the QB control circuit QBC is negatively shifted, the third low level voltage GVSS1 may be set to be higher than the second low level voltage GVSS2 in order to prevent the voltage drop of the QB node caused by the voltage drop of the gate node of the QB charging transistor T4.

In the section in which the Q node is in the high level voltage state and the QB node is in the low level voltage state, the second control transistor T4q having the gate node connected to the Q node may be turned on, and the QB charging transistor T4 for charging the QB node may be turned off.

Accordingly, in the section in which the Q node is in the high level voltage state and the QB node is in the low level voltage state, the third low level voltage GVSS1 higher than the second low level voltage GVSS2 may be applied to the gate node of the QB charging transistor T4 through the second control transistor T4q (A). In this case, the second low level voltage GVSS2 may be applied to the QB node, which is the source node of the QB charging transistor T4.

The potential difference Vgs between the gate node and the source node of the QB charging transistor T4 may correspond to the difference between the third low level voltage GVSS1 and the second low level voltage GVSS2.

As described above, in order to prevent the voltage drop of the QB node caused by the voltage drop of the gate node of the QB charging transistor T4, the potential difference Vgs between the gate node and the source node of the QB charging transistor T4 may have a positive value when the third low level voltage GVSS1 is set to be higher than the second low level voltage GVSS2 (A). Thus, the QB charging transistor T4 may fail to remain completely turned off. Accordingly, an unwanted leakage current may be generated in the QB charging transistor T4.

Also, referring to FIG. 9, in the section in which the QB node is in the high level voltage state and the Q node is in the low level voltage state, the QB charging transistor T4 for charging the QB node may be turned on, and the second control transistor T4q having the gate node connected to the Q node may be turned off.

Referring to FIG. 9, in the section in which the QB node is in the high level voltage state and the Q node is in the low level voltage state, when a ripple occurs in the Q node, the second control transistor T4q may be undesirably turned on by the ripple of the Q node.

According to the unwanted turn-on of the second control transistor T4q due to the ripple of the Q node, the third low level voltage GVSS1 may be undesirably applied to the gate node of the QB charging transistor T4. Accordingly, the QB charging transistor T4 may fail to remain turned on for QB node charging and may be turned off. In this case, the first driving voltage GVDD_o, which is a high level voltage, may be applied to the source node of the QB charging transistor T4.

When the third low level voltage GVSS1 is applied to the gate node of the QB charging transistor T4, the QB charging transistor T4 may be undesirably turned off by the ripple of the Q node, and the voltage of the QB node may fail to maintain the high level voltage state and may be lowered.

Referring to FIG. 9, a first phenomenon (phenomenon related to part A) in which an undesired leakage current occurs in the QB charging transistor T4 in the section in which the Q node is in the high level voltage state and the QB node is in the low level voltage state and a second phenomenon (phenomenon related to part B) in which the voltage of the QB node drops due to a ripple of the Q node in the section in which the Q node is in the low level voltage state and the QB node is in the high level voltage state may lower the gate driving performance, which may lead to the degradation of image quality.

Accordingly, embodiments of the present disclosure disclose an improved gate driving circuit 130 capable of preventing or reducing the first and second phenomena while being applicable to the sensing function of the display device 100. The improved gate driving circuit 130 according to embodiments of the present disclosure will be described below.

Figure 10:
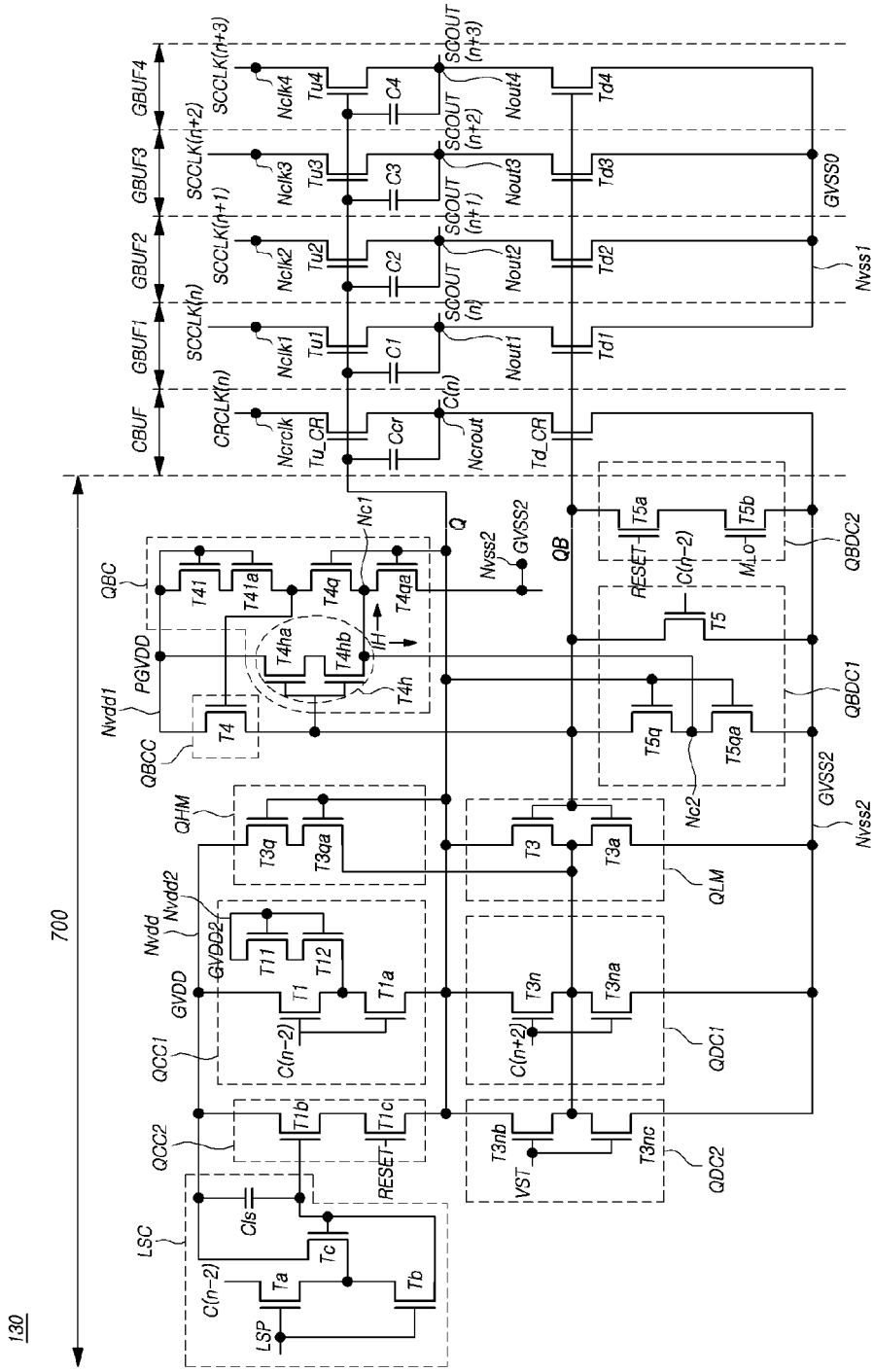
FIG. 10 illustrates an improved gate driving circuit included in a display device according to embodiments of the present disclosure when the display device has a sensing function.
Figure 11:
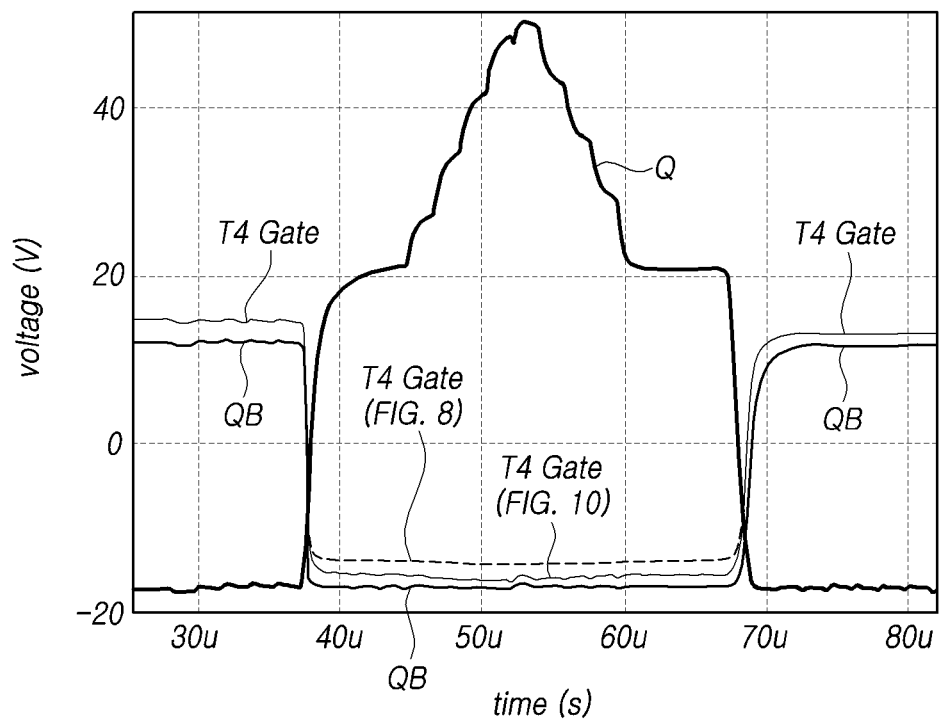
FIGS. 11 and 12 illustrate voltage waveforms at main nodes in an improved gate driving circuit of FIG. 10.
Figure 12:
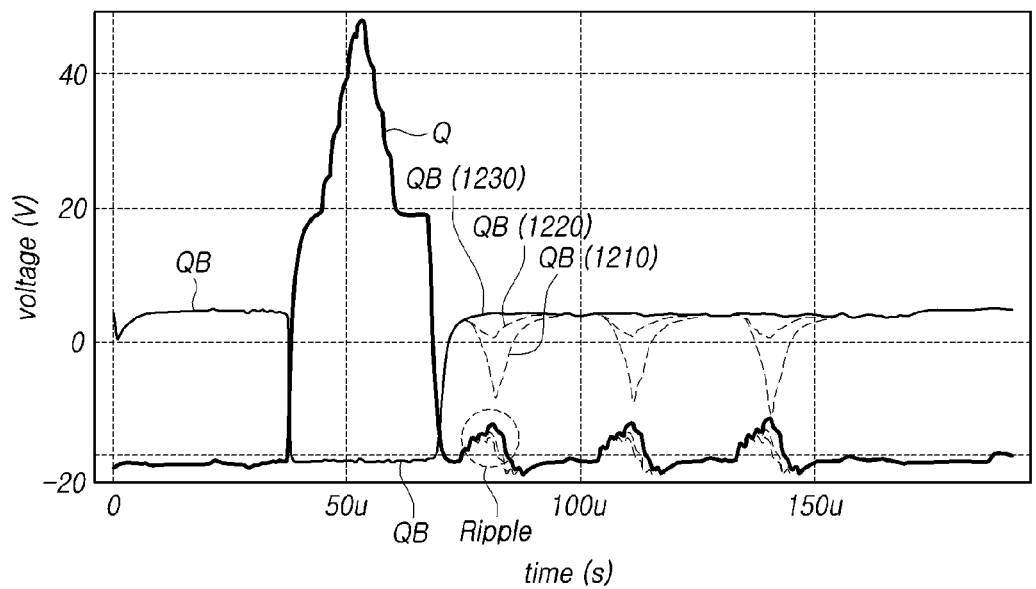

FIG. 10 shows the improved gate driving circuit 130 included in the display device 100 when the display device 100 according to embodiments of the present disclosure has a sensing function. FIGS. 11 and 12 show voltage waveforms at main nodes (the Q node, the QB node, and the T4 Gate) in the improved gate driving circuit 130 of FIG. 10. However, in describing the improved gate driving circuit 130 of FIG. 10, the description of the same configuration and details as those of the gate driving circuit 130 of FIG. 8 will be omitted. However, the gate driving circuit 130 shown in FIG. 10 is a partial stage circuit of the entire gate driving circuit 130.

Referring to FIG. 10, the improved gate driving circuit 130 according to embodiments of the present disclosure may include a first gate output buffer circuit GBUF1 and a control circuit 700.

The first gate output buffer circuit GBUF1 may include a first pull-up transistor Tu1 and a first pull-down transistor Td1.

The control circuit 700 may control the voltage of the Q node electrically connected to the gate node of the first pull-up transistor Tu1 and the voltage of the QB node electrically connected to the gate node of the first pull-down transistor Td1.

The first pull-up transistor Tu1 may be connected between a first clock signal input node Nclk1 and a first gate output node Nout1. The first pull-down transistor Td1 may be connected between the first gate output node Nout1 and the first low level voltage node Nvss1.

The first gate output buffer circuit GBUF1 may output a first gate signal SCOUT(n) to a first gate line GL through the first gate output node Nout1.

Referring to FIG. 10, when the display device 100 according to embodiments of the present disclosure has a sensing function (e.g., a mobility sensing function), the control circuit 700 included in the improved gate driving circuit 130 according to embodiments of the present disclosure may include a line selection circuit LSC, Q charging circuits QCC1 and QCC2 for charging Q nodes, Q discharging circuits QDC1 and QDC2 for discharging Q nodes, holding circuits QHM and QLM for stably holding the voltage state of Q nodes, a QB charging circuit QBCC for charging QB nodes, QB discharging circuits QBDC1 and QBDC2 for discharging QB nodes, a QB control circuit QBC, etc.

The line selection circuit LSC, the Q charging circuits QCC1 and QCC2, the Q discharging circuits QDC1 and QDC2, and the holding circuits QHM and QLM included in the improved gate driving circuit 130 of FIG. 10 may be the same as the line selection circuit LSC, the Q charging circuits QCC1 and QCC2, the Q discharging circuits QDC1 and QDC2, and the holding circuits QHM and QLM included in the gate driving circuit of FIG. 8.

The QB charging circuit QBCC, the QB discharging circuits QBDC1 and QBDC2, and the QB control circuit QBC included in the improved gate driving circuit 130 of FIG. 10 may be different from the QB charging circuit QBCC, the QB discharging circuits QBDC1 and QBDC2, and the QB control circuit QBC included in the gate driving circuit 130 of FIG. 8.

The QB charging circuit QBCC may include a first transistor T4. The first transistor T4 may correspond to the QB charging transistor T4 of FIG. 8.

The first QB discharging circuit QBDC1 may include two second transistors T5q and T5qa. The two second transistors T5q and T5qa may correspond to the first Q discharging transistor T5q of FIG. 8.

The QB control circuit QBC may include a third transistor T4h, fourth transistors T41 and T41a, and two fifth transistors T4q and T4qa. The third transistor T4h may be a transistor that is not included in the QB control circuit QBC of FIG. 8. The fourth transistors T41 and T41a may correspond to the first control transistors T41 and T41a included in the QB control circuit QBC of FIG. 8. The two fifth transistors T4q and T4qa may correspond to the second control transistor T4q included in the QB control circuit QBC of FIG. 8.

Referring to FIG. 10, the control circuit 700 may include the first transistor T4 connected between the first driving voltage node Nvdd1 and the QB node, the two second transistors T5q and T5qa connected in series between the QB node and the second low level voltage node Nvss2, the third transistor T4h connected between the first driving voltage node Nvdd1 and the connection node Nc2 of the two second transistors T5q and T5qa, the fourth transistors T41 and T41a connected between the first driving voltage node Nvdd1 and the gate node of the first transistor T4, and the two fifth transistors T4q and T4qa connected in series between the second low level voltage node Nvss2 and the gate node of the first transistor T4.

Referring to FIG. 10, the connection node Nc1 of the two fifth transistors T4q and T4qa may be electrically connected to the source node or the drain node of the third transistor T4h. Referring to FIG. 10, the drain node or the source node of the third transistor T4h may be connected to the first driving voltage node Nvdd1. Here, a first driving voltage PGVDD may be applied to the first driving voltage node Nvdd1. The first driving voltage PGVDD applied to the first driving voltage node Nvdd1 of FIG. 10 may be the same as the first driving voltage GVDD_o applied to the first driving voltage node Nvdd1 of FIG. 8.

Referring to FIG. 10, the source node or the drain node of the third transistor T4h may be connected to the connection node Nc1 of the two fifth transistors T4q and T4qa and the connection node Nc2 of the two second transistors T5q and T5qa.

Referring to FIG. 10, the gate node of each of the two second transistors T5q and T5qa may be connected to the Q node.

Referring to FIG. 10, the gate node of each of the two fifth transistors T4q and T4qa may be connected to the Q node.

Referring to FIG. 10, the gate node of the third transistor T4h may be connected to the QB node.

Referring to FIG. 10, the third transistor T4h may include two transistors T4ha and T4hb connected in series between the first driving voltage node Nvdd1 and the connection node Nc2 of the two second transistors T5q and T5qa. That is, the third transistor T4h may include two transistors T4ha and T4hb.

Referring to FIG. 10, the gate node of each of the two transistors T4ha and T4hb may be connected in common to the QB node.

Referring to FIG. 10, the second low level voltage GVSS2 applied to the second low level voltage node Nvss2 may be lower than the first low level voltage GVSS0 applied to the first low level voltage node Nvss1.

Referring to FIG. 10, the control circuit 700 may further include a first Q charging circuit QCC1 and a first Q discharging circuit QDC1.

The first Q charging circuit QCC1 may be connected between the Q node and the second driving voltage node Nvdd and configured to supply the second driving voltage GVDD to the Q node during an active period.

The first Q discharging circuit QDC1 may be connected between the Q node and the second low level voltage node Nvss2 and configured to supply the second low level voltage GVSS2 to the Q node during the active period.

The transistor configuration of each of the first Q charging circuit QCC1 and the first Q discharging circuit QDC1 may be the same as that of FIG. 8.

Referring to FIG. 10, the control circuit 700 may further include a second Q charging circuit QCC2 and a second Q discharging circuit QDC2.

The second Q charging circuit QCC2 may be connected between the Q node and the second driving voltage node Nvdd and configured to supply the second driving voltage GVDD to the Q node during a blank period.

The second Q discharging circuit QDC2 may be connected between the Q node and the second low level voltage node Nvss2 and configured to supply the second low level voltage GVSS2 to the Q node during the blank period.

The transistor configuration of each of the second Q charging circuit QCC2 and the second Q discharging circuit QDC2 may be the same as that of FIG. 8.

Referring to FIG. 10, the control circuit 700 may further include a QB charging circuit QBCC and a first QB discharging circuit QBDC1.

The QB charging circuit QBCC may be connected between the first driving voltage node Nvdd1 and the QB node and configured to supply the first driving voltage PGVDD to the QB node.

The first QB discharging circuit QBDC1 may be connected between the QB node and the second low level voltage node Nvss2 and configured to supply the second low level voltage GVSS2 to the QB node during the active period.

Referring to FIG. 10, the QB charging circuit QBCC may include a first transistor T4. The first QB discharging circuit QBDC1 may include two second transistors T5q and T5qa.

Referring to FIG. 10, the control circuit 700 may further include a second QB discharging circuit QBDC2. The second QB discharging circuit QBDC2 may be connected between the QB node and the second low level voltage node Nvss2 and configured to supply the second low level voltage GVSS2 to the QB node during the blank period.

The transistor configuration of the second QB discharging circuit QBDC2 may be the same as that of FIG. 8.

Referring to FIG. 10, the improved gate driving circuit 130 may further include a second gate output buffer circuit GBUF2 including a second pull-up transistor Tu2 and a second pull-down transistor Td2.

The second pull-up transistor Tu2 may be connected between a second clock signal input node Nclk2 and a second gate output node Nout2. The second pull-down transistor Td2 may be connected between the second gate output node Nout2 and the first low level voltage node Nvss1.

The gate node of the second pull-up transistor Tu2 may be connected to the Q node. The gate node of the second pull-down transistor Td2 may be connected to the QB node.

The second gate output buffer circuit GBUF2 may output a second gate signal SCOUT(n+1) to a second gate line GL through the second gate output node Nout2.

Referring to FIG. 10, the improved gate driving circuit 130 may further include a carry output buffer circuit CBUF including a carry pull-up transistor Tu_CR and a carry pull-down transistor Td_CR.

The carry pull-up transistor Tu_CR may be connected between a carry clock signal input node Ncrclk and a carry output node Ncrout. The carry pull-down transistor Td_CR may be connected between the carry output node Ncrout and the second low level voltage node Nvss2.

The gate node of the carry pull-up transistor Tu_CR may be connected to the Q node. The gate node of the carry pull-down transistor Td_CR may be connected to the QB node.

The carry output buffer circuit CBUF may output a carry signal C(n) to the previous stage circuit and/or the next stage circuit through the carry output node Ncrout.

Referring to FIG. 10, the improved gate driving circuit 130 may further include a third gate output buffer circuit GBUF3.

The third gate output buffer circuit GBUF3 may include a third pull-up transistor Tu3 and a third pull-down transistor Td3.

The third pull-up transistor Tu3 may be connected between a third clock signal input node Nclk3 and a third gate output node Nout3. The third pull-down transistor Td3 may be connected between the third gate output node Nout3 and the first low level voltage node Nvss1.

Here, a third clock signal SCCLK(n+2) may be input to the third clock signal input node Nclk3. A third gate line GL may be electrically connected to the third gate output node Nout3.

A capacitor C3 may be connected between the third gate output node Nout3 and the gate node of the third pull-up transistor Tu3.

The third gate output buffer circuit GBUF3 may output a third gate signal SCOUT(n+2) to the third gate line GL through the third gate output node Nout3.

Referring to FIG. 10, the improved gate driving circuit 130 may further include a fourth gate output buffer circuit GBUF4.

The fourth gate output buffer circuit GBUF4 may include a fourth pull-up transistor Tu4 and a fourth pull-down transistor Td4.

The fourth pull-up transistor Tu4 may be connected between a fourth clock signal input node Nclk4 and a fourth gate output node Nout4. The fourth pull-down transistor Td4 may be connected between the fourth gate output node Nout4 and the first low-level voltage node Nvss1.

Here, a fourth clock signal SCCLK(n+3) may be input to the fourth clock signal input node Nclk4. A fourth gate line GL may be electrically connected to the fourth gate output node Nout4.

A capacitor C4 may be connected between the fourth gate output node Nout4 and the gate node of the fourth pull-up transistor Tu4.

The fourth gate output buffer circuit GBUF4 may output a fourth gate signal SCOUT(n+3) to the fourth gate line GL through the fourth gate output node Nout4.

Referring to FIGS. 10 and 11, in the section in which the Q node is in the high level voltage state and the QB node is in the low level voltage state, the two fifth transistors T4$q$ and T4$qa$ each having a gate node connected to the Q node may be turned on, and the first transistor T4 for charging the QB node may be turned off.

Here, the two fifth transistors T4$q$ and T4$qa$ may be transistors in which the second control transistor T4$q$ of the FIG. 8 is replaced. The first transistor T4 may be a transistor corresponding to the QB charging transistor T4 of FIG. 8.

In the section in which the Q node is in the high level voltage state and the QB node is in the low level voltage state, the second low level voltage GVSS2 may be applied to the gate node of the first transistor T4 through the two fifth transistors T4$q$ and T4$qa$ that are turned on.

Here, the second low level voltage GVSS2 is a voltage lower than the first low level voltage GVSS0 and a voltage lower than the third low level voltage GVSS1 of FIG. 8.

Accordingly, as shown in FIG. 11, in the section in which the Q node is in the high level voltage state and the QB node is in the low level voltage state, the gate voltage T4 Gate of the first transistor T4 may be lower than the gate voltage T4 Gate of the QB charging transistor T4 of FIG. 8.

Thus, the voltage difference between the gate node and the source node of the first transistor T4 (Vgs=Vg−Vs=GVSS2−GVSS2) is further lowered. In the section in which the Q node is in the high level voltage state and the QB node is in the low level voltage state, the first transistor T4 for charging the QB node may remain completely turned off.

Accordingly, in the section in which the Q node is in the high level voltage state and the QB node is in the low level voltage state, the first phenomenon in which an unwanted leakage current is generated can be reduced or prevented in the first transistor T4 for charging the QB node.

Referring to FIGS. 10 and 12, in the section in which the QB node is in the high level voltage state and the Q node is in the low level voltage state, the first transistor T4 for charging the QB node may be turned on, and the two fifth transistors T4$q$ and T4$qa$ each having a gate node connected to the Q node may be turned off.

The first transistor T4 for charging the QB node is a transistor into which the QB charging transistor T4 for charging the QB node of FIG. 8 is changed, and the two fifth transistors T4$q$ and T4$qa$ are transistors into which the second control transistor T4$q$ of FIG. 8 is changed.

Referring to FIGS. 10 and 12, in the section in which the QB node is in the high level voltage state and the Q node is in the low level voltage state, when a ripple occurs in the Q node, the ripple of the Q node may be applied to the gate nodes of the two fifth transistors T4$q$ and T4$qa$.

When the first driving voltage PGVDD is applied to the gate node of the third transistor T4$h$ through the first transistor T4 which is turned on for QB charging, the third transistor T4$h$ may be turned on. Thus, the first driving voltage PGVDD may be output to the source node of the third transistor T4$h$.

The first driving voltage PGVDD output to the source node of the third transistor T4$h$, which is a high level voltage input IH, may be applied to the connection node Nc1 of the two fifth transistors T4$q$ and T4$qa$.

In this case, although the two fifth transistors T4$q$ and T4$qa$ are undesirably turned on by the ripple of the Q node, the first driving voltage PGVDD applied to the connection node Nc1 of the two fifth transistors T4$q$ and T4$qa$ may keep the first transistor T4 turned on. Here, the first transistor T4 is a transistor that remains turned on for QB charging. It should be understood that, the fifth transistor T4$q$ electrically isolates the second low level voltage node Nvss2 from the gate node of the first transistor T4 when the ripple in the Q node is applied to the gate nodes of the fifth transistors T4$q$, T4$qa$ connected between the gate node of the first transistor T4 and the second low level voltage node Nvss2. This is because the gate-source voltage of the fifth transistor T4$q$ is insufficient to turn on the fifth transistor T4$q$ due to the first driving voltage PGVDD applied at the source node of the fifth transistor T4$q$ is higher than the ripple in the Q node applied to the gate node of the fifth transistor T4$q$.

Therefore, in the section in which the QB node is in the high level voltage state and the Q node is in the low level voltage state, even when a ripple occurs in the Q node, the first driving voltage PGVDD output to the source node of the third transistor T4$h$ is applied to the connection node Nc1 of the two fifth transistors T4$q$ and T4$qa$, and thus the first transistor T4 for QB charging may remain turned on.

Thus, even if a ripple occurs in the Q node, the QB node may remain in the high level voltage state.

Meanwhile, the first driving voltage PGVDD output to the source node of the third transistor T4$h$, which is a high level voltage input IH, may be applied to the connection node Nc2 of the two second transistors T5$q$ and T5$qa$.

When a ripple occurs in the Q node, the ripple may be delivered to the gate nodes of the two second transistors T5$q$ and T5$qa$ for QB node discharging. In this case, the two second transistors T5$q$ and T5$qa$ may be undesirably turned on.

Even in this situation, the first driving voltage PGVDD output to the source node of the third transistor T4$h$, which is a high level voltage input IH, may be applied to the connection node Nc2 of the two second transistors T5$q$ and T5$qa$, and thus the second low level voltage GVSS2 cannot be applied to the QB node (or is heavily attenuated) through the two second transistors T5$q$ and T5$qa$.

Therefore, in the section in which the QB node is in the high level voltage state and the Q node is in the low level voltage state, even when a ripple occurs in the Q node, the first driving voltage PGVDD output to the source node of the third transistor T4$h$ is applied to the connection node Nc2 of the two second transistors T5$q$ and T5$qa$, and thus the QB node may remain in the high level voltage state.

Referring to FIG. 12, among the three waveforms 1210, 1220, and 1230 indicating the voltage state of the QB node, the first waveform 1210 is a waveform in which the voltage drop of the Q node is largest due to the gate driving circuit 130 of FIG. 8 when a ripple occurs in the Q node.

Referring to FIG. 12, the second waveform 1120 may be a waveform in which the voltage drop of the Q node is reduced in the gate driving circuit 130 to which the two fifth transistors T4$q$ and T4$qa$ are applied when a ripple occurs in the Q node.

Referring to FIG. 12, the third waveform 1230 may be a waveform in which the voltage drop of the Q node is mostly removed by the gate driving circuit 130 to which the two fifth transistors T4$q$ and T4$qa$ and the two second transistors T5$q$ and T5$qa$ are all applied when a ripple occurs in the Q node.

Referring to FIG. 12, with the improved gate driving circuit 130, it is possible to reduce or prevent the second phenomenon in which the voltage of the QB node drops due to the ripple of the Q node in the section in which the QB node is in the high level voltage state and the Q node is in the low level voltage state.

A summary of the above description of the embodiments of the present disclosure is as follows.

Embodiments of the present disclosure may provide a gate driving circuit including a first gate output buffer circuit including a first pull-up transistor and a first pull-down transistor and a control circuit configured to control the voltage of the QB node connected to the gate node of the first pull-down transistor and the voltage of the Q node connected to the gate node of the first pull-up transistor.

The first pull-up transistor may be connected between a first clock signal input node and a first gate output node, and the first pull-down transistor may be connected between the first gate output node and a first low level voltage node.

The control circuit may include a first transistor connected between the first driving voltage node and the QB node, two second transistors connected in series between the QB node and the second low level voltage node, a third transistor connected between the connection node of the two second transistors and the first driving voltage node, a fourth transistor connected between the gate node of the first transistor and the first driving voltage node, and two fifth transistors connected in series between the gate node of the first transistor and the second low level voltage node.

The connection node of the two fifth transistors may be electrically connected to the source node or the drain node of the third transistor.

The drain node or source node of the third transistor may be connected to the first driving voltage node, and the source node or the drain node of the third transistor may be connected to the connection node of the two second transistors and the connection node of the two fifth transistors.

The gate node of each of the two second transistors may be connected to the Q node.

The gate node of the third transistor may be connected to the QB node.

The gate node of each of the two fifth transistors may be connected to the Q node.

The third transistor may include two transistors connected in series between the connection node of the two second transistors and the first driving voltage node.

The second low level voltage applied to the second low level voltage node may be lower than the first low level voltage applied to the first low level voltage node.

The gate driving circuit may further include a second gate output buffer circuit including a second pull-up transistor and a second pull-down transistor.

The second pull-up transistor may be connected between a second clock signal input node and a second gate output node. The gate node of the second pull-up transistor may be connected to the Q node.

The second pull-down transistor may be connected between the second gate output node and the first low level voltage node. The gate node of the second pull-down transistor may be connected to the QB node.

The gate driving circuit may further include a carry output buffer circuit including a carry pull-up transistor and a carry pull-down transistor.

The carry pull-up transistor may be connected between a carry clock signal input node and a carry output node. The gate node of the carry pull-up transistor may be connected to the Q node.

The carry pull-down transistor may be connected between the carry output node and the second low level voltage node. The gate node of the carry pull-down transistor may be connected to the QB node.

The control circuit may further include a first Q charging circuit connected between the second driving voltage node and the Q node and configured to supply a second driving voltage to the Q node during an active period and a first Q discharging circuit connected between the Q node and the second low level voltage node and configured to supply a second low level voltage to the Q node during the active period.

The control circuit may further include a second Q charging circuit connected between the second driving voltage node and the Q node and configured to supply a second driving voltage to the Q node during a blank period and a second Q discharging circuit connected between the Q node and the second low level voltage node and configured to supply a second low level voltage to the Q node during the blank period.

The control circuit may further include a QB charging circuit connected between the first driving voltage node and the QB node and configured to supply a first driving voltage to the QB node and a first QB discharging circuit connected between the QB node and the second low level voltage node and configured to supply a second low level voltage to the QB node during the active period.

The QB charging circuit may include a first transistor.

The first QB discharging circuit may include two second transistors.

The control circuit may further include a second QB discharging circuit connected between the QB node and the second low level voltage node and configured to supply a second low level voltage to the QB node during the blank period.

Embodiments of the present disclosure may provide a display device including a display panel including multiple gate lines and a gate driving circuit configured to drive the multiple gate lines.

The gate driving circuit may include a first gate output buffer circuit including a first pull-up transistor and a first pull-down transistor and a control circuit configured to control the voltage of the QB node connected to the gate node of the first pull-down transistor and the voltage of the Q node connected to the gate node of the first pull-up transistor.

The first pull-up transistor may be connected between a first clock signal input node and a first gate output node, and the first pull-down transistor may be connected between the first gate output node and a first low level voltage node.

The control circuit may include a first transistor connected between the first driving voltage node and the QB node, two second transistors connected in series between the QB node and the second low level voltage node, a third transistor connected between the connection node of the two second transistors and the first driving voltage node, a fourth transistor connected between the gate node of the first transistor and the first driving voltage node, and two fifth transistors connected in series between the gate node of the first transistor and the second low level voltage node.

The connection node of the two fifth transistors may be electrically connected to the source node or the drain node of the third transistor.

The drain node or source node of the third transistor may be connected to the first driving voltage node, and the source node or the drain node of the third transistor may be connected to the connection node of the two second transistors and the connection node of the two fifth transistors.

The gate node of each of the two second transistors may be connected to the Q node.

The gate node of the third transistor may be connected to the QB node.

The gate node of each of the two fifth transistors may be connected to the Q node.

The third transistor may include two transistors connected in series between the connection node of the two second transistors and the first driving voltage node.

The second low level voltage applied to the second low level voltage node may be lower than the first low level voltage applied to the first low level voltage node.

According to embodiments of the present disclosure, it is possible to provide a display device and a gate driving circuit configured to output a gate signal having a normal signal waveform.

According to embodiments of the present disclosure, it is possible to provide a display device and a gate driving circuit configured to output a gate signal having a normal signal waveform while performing gate driving for sensing-driving to sense the mobility of a driving transistor in a sub-pixel.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A gate driving circuit comprising:
   a first gate output buffer circuit including a first pull-up transistor and a first pull-down transistor; and
   a control circuit configured to control a voltage of a Q node connected to a gate node of the first pull-up transistor and a voltage of a QB node connected to a gate node of the first pull-down transistor;
   wherein,
   the first pull-up transistor is connected between a first clock signal input node and a first gate output node, the first pull-down transistor is connected between the first gate output node and a first low level voltage node,
   the control circuit includes:
      a first transistor connected between a first driving voltage node and the QB node;
      two second transistors connected in series between the QB node and a second low level voltage node;

a third transistor connected between a connection node of the two second transistors and the first driving voltage node, the third transistor having a gate node connected to the QB node;
a fourth transistor connected between a gate node of the first transistor and the first driving voltage node; and
two fifth transistors connected in series between the gate node of the first transistor and the second low level voltage node, and
a connection node of the two fifth transistors is electrically connected to a source node or a drain node of the third transistor.

2. The gate driving circuit of claim 1, wherein
one of the drain node or the source node of the third transistor is connected to the first driving voltage node, and
the other of the drain node or the source node of the third transistor is connected to the connection node of the two second transistors and the connection node of the two fifth transistors.

3. The gate driving circuit of claim 1, wherein each of the two second transistors has a gate node connected to the Q node.

4. The gate driving circuit of claim 1, wherein each of the two fifth transistors has a gate node connected to the Q node.

5. The gate driving circuit of claim 1, wherein the third transistor comprises two transistors connected in series between the first driving voltage node and the connection node of the two second transistors.

6. The gate driving circuit of claim 1, wherein a second low level voltage applied to the second low level voltage node is lower than a first low level voltage applied to the first low level voltage node.

7. The gate driving circuit of claim 1, further comprising a second gate output buffer circuit including a second pull-up transistor and a second pull-down transistor,
wherein
the second pull-up transistor is connected between a second clock signal input node and a second gate output node, and the second pull-down transistor is connected between the second gate output node and the first low level voltage node, and
the second pull-up transistor has a gate node connected to the Q node, and the second pull-down transistor has a gate node connected to the QB node.

8. The gate driving circuit of claim 1, further comprising a carry output buffer circuit including a carry pull-up transistor and a carry pull-down transistor,
wherein
the carry pull-up transistor is connected between a carry clock signal input node and a carry output node, and the carry pull-down transistor is connected between the carry output node and the second low level voltage node, and
the carry pull-up transistor has a gate node connected to the Q node, and the carry pull-down transistor has a gate node connected to the QB node.

9. The gate driving circuit of claim 1, wherein the control circuit further comprises:
a first Q charging circuit connected between a second driving voltage node and the Q node and configured to supply a second driving voltage to the Q node during an active period; and
a first Q discharging circuit connected between the Q node and the second low level voltage node and configured to supply a second low level voltage to the Q node during the active period.

10. The gate driving circuit of claim 1, wherein the control circuit further comprises:
a second Q charging circuit connected between a second driving voltage node and the Q node and configured to supply a second driving voltage to the Q node during a blank period; and
a second Q discharging circuit connected between the Q node and the second low level voltage node and configured to supply a second low level voltage to the Q node during the blank period.

11. The gate driving circuit of claim 1, wherein
the control circuit further comprises:
a QB charging circuit connected between the first driving voltage node and the QB node and configured to supply a first driving voltage to the QB node; and
a first QB discharging circuit connected between the QB node and the second low level voltage node and configured to supply a second low level voltage to the QB node during an active period,
the QB charging circuit comprises the first transistor, and
the first QB discharging circuit comprises the two second transistors.

12. The gate driving circuit of claim 11, wherein the control circuit further comprises a second QB discharging circuit connected between the QB node and the second low level voltage node and configured to supply the second low level voltage to the QB node during a blank period.

13. A display device comprising:
a display panel including a plurality of gate lines; and
a gate driving circuit configured to drive the plurality of gate lines,
wherein,
the gate driving circuit includes:
a first gate output buffer circuit including a first pull-up transistor and a first pull-down transistor; and
a control circuit configured to control a voltage of a Q node connected to a gate node of the first pull-up transistor and a voltage of a QB node connected to a gate node of the first pull-down transistor,
the first pull-up transistor is connected between a first clock signal input node and a first gate output node, and
the first pull-down transistor is connected between the first gate output node and a first low level voltage node, and
the control circuit includes:
a first transistor connected between a first driving voltage node and the QB node;
two second transistors connected in series between the QB node and a second low level voltage node;
a third transistor connected between a connection node of the two second transistors and the first driving voltage node, the third transistor having a gate node connected to the QB node;
a fourth transistor connected between a gate node of the first transistor and the first driving voltage node; and
two fifth transistors connected in series between the gate node of the first transistor and the second low level voltage node.

14. The display device of claim 13, wherein
one of the drain node or the source node of the third transistor is connected to the first driving voltage node, and the other of the drain node or the source node of the third transistor is connected to the connection node of the two second transistors and the connection node of the two fifth transistors.

15. The display device of claim 13, wherein each of the two second transistors has a gate node connected to the Q node.

16. The display device of claim 13, wherein each of the two fifth transistors has a gate node connected to the Q node.

17. The display device of claim 13, wherein the third transistor comprises two transistors connected in series between the first driving voltage node and the connection node of the two second transistors.

18. The display device of claim 13, wherein a second low level voltage applied to the second low level voltage node is lower than a first low level voltage applied to the first low level voltage node.

19. A display device comprising:
a display panel including a gate line; and
a gate driving circuit which, in operation, drives the gate line, the gate driving circuit including:
a gate output buffer circuit coupled to the gate line, the gate output buffer circuit including:
a pull-up transistor having a gate node connected to a Q node; and
a pull-down transistor having a gate node connected to a QB node; and
a control circuit including a first transistor coupled to the QB node, the control circuit, in operation:
applying a second low level voltage of a second low level voltage node to a gate node of the first transistor and a source node of the first transistor when voltage of the Q node is at a first level; and
electrically isolating the second low level voltage node from the gate node of the first transistor when a ripple in the voltage of the Q node is applied to a gate node of a second transistor connected between the gate node of the first transistor and the second low level voltage node.

20. The display device of claim 19, wherein the second transistor has a gate node connected to the Q node.

21. The display device of claim 19, wherein the pull-up transistor is connected between a clock signal input node and a gate output node, the pull-down transistor is connected between the gate output node and a first low level voltage node, and the second low level voltage applied to the second low level voltage node is lower than a first low level voltage applied to the first low level voltage node.

* * * * *